United States Patent
Masayuki et al.

(10) Patent No.: US 6,424,030 B2
(45) Date of Patent: Jul. 23, 2002

(54) SEMICONDUCTOR MEMORY MODULE HAVING DOUBLE-SIDED STACKED MEMORY CHIP LAYOUT

(75) Inventors: Watanabe Masayuki, Yokohama; Sugano Toshio, Kokubunji; Tsukui Seiichiro, Komoro; Ono Takashi, Akita; Wakashima Yoshiaki, Kawasaki, all of (JP)

(73) Assignees: Hitachi, Ltd.; Hitachi Tobu Semiconductor, Ltd.; Akita Electronics Co., Ltd., all of (JP)

( * ) Notice: Subject to any disclaimer, the term of this patent is extended or adjusted under 35 U.S.C. 154(b) by 0 days.

(21) Appl. No.: 09/863,450

(22) Filed: May 24, 2001

Related U.S. Application Data

(63) Continuation of application No. 09/292,999, filed on Apr. 16, 1999, now Pat. No. 6,262,488, which is a continuation of application No. 08/984,330, filed on Dec. 3, 1997, now Pat. No. 5,910,685, which is a continuation of application No. 08/763,469, filed on Dec. 10, 1996, now Pat. No. 5,708,298, which is a continuation of application No. 08/323,709, filed on Oct. 18, 1994, now Pat. No. 5,587,341, which is a continuation of application No. 07/890,423, filed on May 29, 1992, now abandoned, which is a division of application No. 07/796,873, filed on Nov. 25, 1991, now Pat. No. 5,138,438, which is a continuation of application No. 07/607,411, filed on Oct. 31, 1990, now abandoned, which is a continuation of application No. 07/209,739, filed on Jun. 22, 1988, now Pat. No. 4,982,265.

(30) Foreign Application Priority Data

Jun. 24, 1987 (JP) .............................. 62-155478
Sep. 11, 1987 (JP) .............................. 62-226307

(51) Int. Cl.[7] .............................................. H01L 23/02
(52) U.S. Cl. ...................... 257/685; 257/686; 257/777; 257/723
(58) Field of Search ................................ 257/686, 685, 257/777, 666, 723–725; 361/783; 438/123, 106, 107, 109, 110

(56) References Cited

U.S. PATENT DOCUMENTS

| 3,370,203 A | 2/1968 | Kravitz et al. | |
| 3,577,037 A | 5/1971 | Di Pietro et al. | 257/778 |
| 4,151,543 A | 4/1979 | Hayakawa et al. | 257/778 |
| 4,363,076 A | 12/1982 | McIver | 257/686 |
| 4,398,235 A | 8/1983 | Lutz et al. | 257/686 |

FOREIGN PATENT DOCUMENTS

| JP | 54-23484 | | 2/1979 | | 257/777 |
| JP | 56-137665 | | 10/1981 | | 257/777 |
| JP | 59-136963 | | 8/1984 | | 257/686 |
| JP | 59-222947 | | 12/1984 | | 29/827 |
| JP | 1-170028 | * | 7/1989 | | 257/723 |

* cited by examiner

*Primary Examiner*—Jhihan B Clark
(74) *Attorney, Agent, or Firm*—Pennie & Edmonds LLP

(57) ABSTRACT

In the present invention, memory chips are stuck together in stacked fashion by TAB (tape automated bonding), and a multiple memory chip and lead complex like an SOP (small out-line package) is formed of the chips and leads, whereby a memory module of high packaging density can be realized by a flat packaging technique.

10 Claims, 23 Drawing Sheets

FIG. 13(a)        FIG. 13(b)
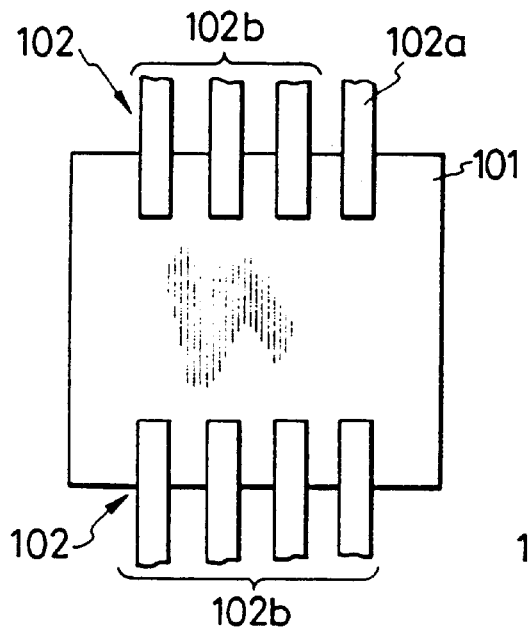 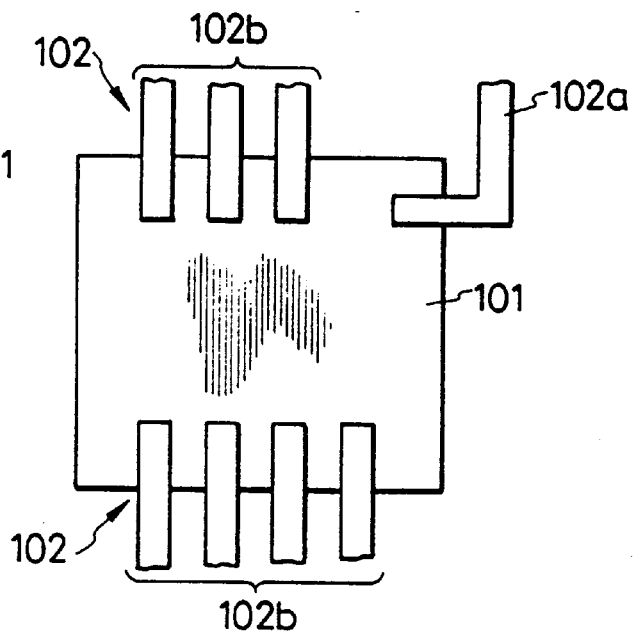
FIG. 13(c)
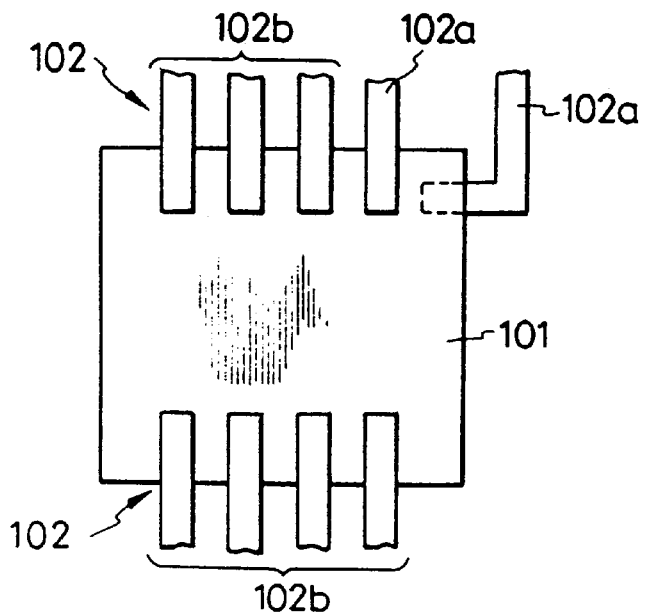

SEMICONDUCTOR MEMORY MODULE HAVING DOUBLE-SIDED STACKED MEMORY CHIP LAYOUT

RELATED APPLICATIONS

This is a continuation of application Ser. No. 09/292,999, filed Apr. 16, 1999, now U.S. Pat. No. 6,262,488, which is a continuation of application Ser. No. 08/984,330, filed Dec. 3, 1997, now U.S. Pat. No. 5,910,685, which is a continuation of application Ser. No. 08/763,469, filed Dec. 10, 1996, now U.S. Pat. No. 5,708,298 which is continuation of application Ser. No. 08/323,709, filed Oct. 18, 1994, now U.S. Pat. No. 5,587,341, which is a continuation of Ser. No. 07/890,423, filed May 29, 1992, now abandoned, which is a divisional of Ser. No. 07/796,873, filed Nov. 25, 1991, now U.S. Pat. No. 5,138,438, which is a continuation of Ser. No. 07/607,411, filed Oct. 31, 1990, now abandoned, which is a continuation of Ser. No. 07/209,739 filed Jun. 22, 1988, now U.S. Pat. No. 4,982,265.

BACKGROUND OF THE INVENTION

The present invention relates to a semiconductor device. More particularly, it relates to a semiconductor device which is so constructed that a semiconductor chip is put into the form of a module and that a plurality of semiconductor chips are mounted on a module base plate.

A semiconductor device of high packaging density, which is constructed in such a way that a plurality of packages each having a semiconductor chip molded therein are installed on a mounting base plate (a module base plate), is described in "Nikkei Electronics" issued by Nikkei McGraw-Hill Inc., Extra Issue no. 2 "Microdevices," p. 150.

Further, the present invention relates to a technique for installing tape carriers in stacked fashion.

One of techniques for assembling semiconductor elements is the tape carrier system. This system is also termed the "film carrier" or "TAB (Tape Automated Bonding)" system, etc. It is a method wherein semiconductor elements are successively assembled on an elongate resinous tape which is provided with sprocket holes (perforation holes). The tape carrier is such that lead patterns conforming to the electrode arrangements of the semiconductor elements (chips) are formed on a resin film which has the sprocket holes and device holes. By way of example, the tape carrier is prepared via the steps of slitting a polyimide film coated with a binder, into a proper width; punching the sprocket holes for feed and the device holes for assembling the chips therein, in the slitted film; laminating the punched film with a copper foil; and forming the desired lead patterns by the use of a photoresist technique and an etching technique.

An example of the tap carrier semiconductor chip mounting technique is described in "VLSI TECHNOLOGY" 1983 copyright, p. 558, McGraw-Hill Book Company, Japan.

BRIEF SUMMARY OF THE INVENTION

However, there are problems with tape carrier chip mounting technique of prior art which the present invention solves. The specific problems, of which is it the object of the present invention to overcome, are as follows:

The footprint area of the mounted chip is difficult to reduce. Therefore, increasing the packaging density of chips per unit area on the module's base plate is difficult.

Further, regarding the prior-art tape carrier stated before, the tape carriers of one kind correspond to one predetermined layout and have the same lead patterns. Therefore, the tape carriers of the same kind cannot be installed on a mounting base plate in stacked fashion.

This poses the problem that, when the semiconductor elements are to be installed at a high density, the tape carriers of the same kind need to be juxtaposed on the mounting base plate, so wiring on the surface of the mounting base plate such as a printed-wiring circuit board becomes complicated. Moreover, wire breakage, etc. is prone to occur, and the reliability of the assembled device lowers.

An object of the present invention is to increase the packaging density of a multichip semiconductor device.

Another object of the present invention is to provide a high-density memory device which is suited to flat packaging.

Another object of the present invention is to provide a memory device which is capable of high-density packaging.

Another object of the present invention is to provide a high-density flat packaging technique which matches well with the TAB (tape automated bonding) technology. Another object of the present invention is to provide a high-density packaging method which can fully exploit the TAB technology.

Another object of the present invention is to provide a method of assembling memory devices which is capable of simplifying the assembly process and reducing labor.

Another object of the present invention is to provide a memory module which can install a large number of memory chips compactly.

Another object of the present invention is to provide a multiple chip and lead complex which exhibits a good solderability at a solder reflow step.

The aforementioned and other objects and novel features of the present invention will become apparent from the description of the specification and the accompanying drawings.

A typical aspect of performance of the present invention will be briefly summarized below:

The bump electrodes of a semiconductor chip are connected to leads, and a plurality of such semiconductor chips having the leads are connected to the wiring of a module base plate, thereby to construct a semiconductor device.

According to the above-stated expedient, the semiconductor chips are not sealed within packages, therefore the packaging density of the semiconductor chips on the module base plate can be increased.

Another typical aspect of performance of the present invention is as follows:

In the present invention, a plurality of tape carriers of an identical kind, the respective lead patterns of which are partly different, are prepared. An alteration for the difference is limited to, for example, only a lead for a chip select signal. Subsequently, the tape carriers thus having the partly different lead patterns are installed on a mounting base plate in stacked fashion.

As described above, the respective lead patterns of the tape carriers to be installed are made partly different so as to permit the stacked installation of these tape carriers, so that semiconductor elements can be installed at a high density, the wiring of the mounting base plate is simplified, and the reliability of the installed device can be enhanced.

In still another typical aspect of performance of the present invention, a semiconductor integrated circuit memory device comprises:

(a) first and second SRAM semiconductor chips each of which is either of substantially square or rectangular flat shape and has a first and second principal surface, said first principal surface being formed with major portions of an SRAM integrated circuit;

(b) a number of electrode pads which are provided near a pair of opposing latera of said first principal surface of said each chip;

(c) a chip select pad which is provided near either of said pair of opposing latera of said first principal surface of said each chip;

(d) a number of leads each of which is made of a metal sheet and an inner end of each of which is connected with a corresponding one of said large number of electrode pads of said each chip;

(e) first and second leads each of which is made of a metal sheet and inner ends of which are connected with the chip select pads of said respective chips;

(f) an insulator member which is interposed between said second principal surface of said first chip and said first principal surface of said second chip extending near the former substantially in parallel therewith; and (g) superposed connection portions in which parts of and near outer ends of said large number of leads corresponding to said electrode pads having the same functions are respectively superposed and connected so that their extending directions may agree.

In yet another typical aspect of performance of the present invention, a method of assembling a semiconductor integrated circuit wherein memory chips are respectively assembled into a large number of semiconductor chip mounting openings which are provided along a central part of a carrier tape, by connecting them through bump electrodes, comprising:

(a) the step of gang-bonding memory chips having either of the same patterns or substantially the same patterns, to first and second carrier tapes through bump electrodes, respectively, where each of said first and second carrier tapes has a number of leads made of metal sheets on a first principal surface and in a chip mounting opening, and said first and second carrier tapes have either of substantially the same patterns or the same patterns, except leads which are to be respectively connected with either of chip select terminals and terminals equivalent thereto;

(b) the step of gang-bonding memory chips having either of the same patterns or substantially the same patterns, to corresponding openings of such first and second carrier tapes through bump electrodes, respectively;

(c) the step of superposing said first and second carrier tapes so as to hold the agreeing patterns in correspondence, and pressedly fixing the superposedly extending leads in the respective openings, thereby to form multiple chip and lead complexes each of which includes the plurality of memory chips and the number of leads; and (d) the step of separating said complexes from each other.

BRIEF DESCRIPTION OF THE DRAWINGS

FIGS. 13(A)–13(C) are principle diagrams showing Embodiment 2 of the present invention, respectively;

DETAILED DESCRIPTION OF THE INVENTION (1) Embodiment 1

In the ensuing description and the accompanying drawings, parts having the same functions will be indicated by numerals the two lower digits of which are identical, unless otherwise specified. The repeated explanation of the parts shall be omitted to the utmost.

EXAMPLE I

Now, Example I of Embodiment 1 of the present invention will be described with reference to the drawings.

Figure 1:
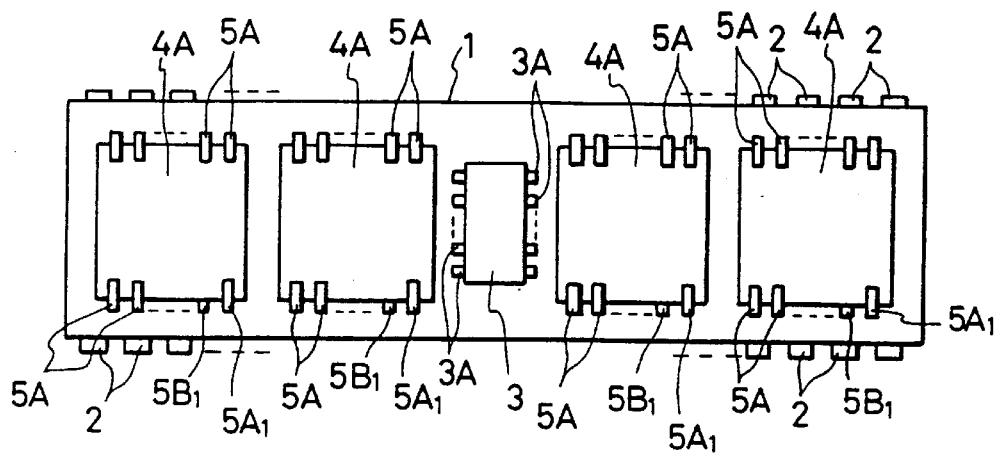
FIG. 1 is a plan view showing the schematic construction of a semiconductor device in Example I of Embodiment 1 of the present invention.
Figure 2:
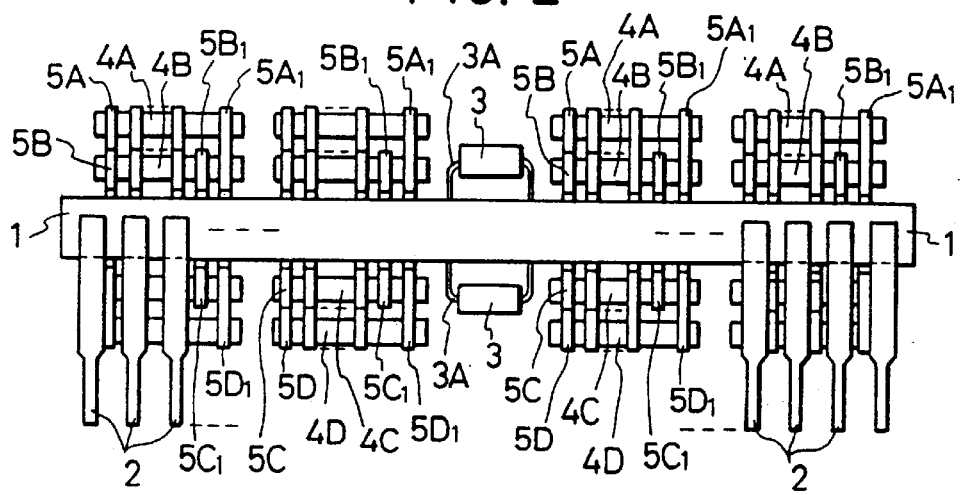
FIG. 2 is a side view showing the schematic construction of the semiconductor device.
Figure 3:
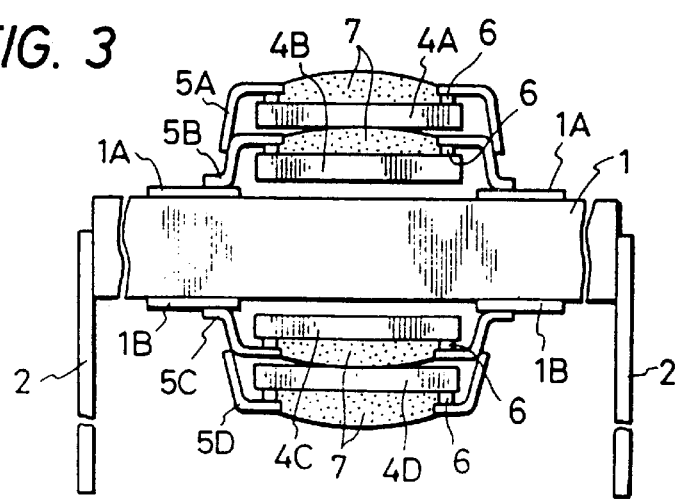
FIG. 3 is a front view showing the schematic construction of the semiconductor device.

FIG. 1 is a plan view showing the schematic construction of a semiconductor device in Example I of Embodiment 1 of the present invention;

FIG. 2 is a side view showing the schematic construction of the semiconductor device; and FIG. 3 is a front view showing the schematic construction of the semiconductor device.

Referring to FIGS. 1 thru 3, numeral 1 designates a module base plate which is constructed by stacking pluralities of ceramic layers and wiring layers by the use of laminated ceramic. Eight semiconductor chips 4A, 4B, 4C and 4D are installed on each of the front surface and rear surface of the module base plate 1. Each of the semiconductor chips 4A, 4B, 4C and 4D has, for example, a static RAM constructed therein. Structurally, it is not sealed with a package made of ceramic, a resin or the like, but its surface provided with semiconductor elements and wiring is molded with a resin 7.

Each of the semiconductor chips 4A, 4B, 4C and 4D is provided with bump electrodes 6 which are made of a solder, gold or the like, and to which leads 5A, 5B, 5C and 5D are respectively connected by TAB (Tape Automated Bonding). The semiconductor chip 4A is stacked over the semiconductor chip 4B in such a way that the individual leads 5A are connected to the leads 5B of the semiconductor chip 4B with, for example, a solder. That is, by way of example, the lead 5A for inputting an address signal to the semiconductor chip 4A is connected to the lead 5B for inputting an address signal to the semiconductor chip 4B. Likewise, the lead 5A for inputting/outputting the data of the semiconductor chip 4A is connected to the lead 5B for inputting/outputting the data of the semiconductor chip 4B. In other words, the respective leads 5A and 5B having the same functions are connected by the use of, for example, the solder. The individual leads 5B are connected to a decoder 3 and leads 2 through wiring (not shown) laid within the module base plate 1. In this regard, the lead $5A_1$ for inputting a chip select signal to the semiconductor chip 4A is connected to the lead 3A of the decoder 3 without being connected with the lead $5B_1$ for inputting a chip select signal to the semiconductor chip 4B. In addition, the lead $5B_1$ is connected the lead 3A different from the aforementioned lead 3A to which the lead $5A_1$ is connected. One semiconductor chip 4A or 4B is selected from among the eight semiconductor chips 4A and 4B by the decoder 3.

The semiconductor chip 4C is overlaid with the semiconductor chip 4D in such a way that the individual leads 5D of the semiconductor chip 4D are connected to the leads 5C of the semiconductor chip 4C with, for example, a solder. The individual leads 5C are connected to a decoder 3 or leads 2 through wiring laid within the module base plate 1. In this regard, the lead $5D_1$ for inputting the chip select signal of the semiconductor chip 4D is directly connected to its corresponding lead 3A of the decoder 3 without being connected with the lead $5C_1$ for inputting the chip select signal of the semiconductor chip 4C. In addition, the lead $5C_1$ is connected to its corresponding lead 3A of the decoder 3 different from the aforementioned lead 3A to which the lead $5D_1$ is connected. One semiconductor chip 4C or 4D is selected from among the eight semiconductor chips 4C and 4D by the decoder 3.

The principal surface, namely, the surface provided with the semiconductor elements and wiring, of each of the semiconductor chips 4A, 4B, 4C and 4D is molded with the resin 7 or silicone rubber 7.

As described above, the semiconductor device is constructed by installing on the module base plate 1 the respective semiconductor chips 4A, 4B, 4C and 4D to which the corresponding leads 5A, SB, 5C and SD are connected by the TAB without encapsulation in packages, whereby the area which the single semiconductor chip 4A, 4B, 4C or 4D occupies on the module base plate 1 can be reduced, and hence, the larger number of semiconductor chips 4A, 4B, 4C and 4D can be installed on the module base plate 1. That is, the packaging density of the semiconductor device can be heightened.

Moreover, since the semiconductor chip 4B is overlaid with the semiconductor chip 4A and also the semiconductor chip 4C with the semiconductor chip 4D, the larger number of semiconductor chips 4A, 4B, 4C and 4D can be installed without enlarging the module base plate 1.

Next, a modification to Example I of Embodiment 1 will be described.

Figure 4:
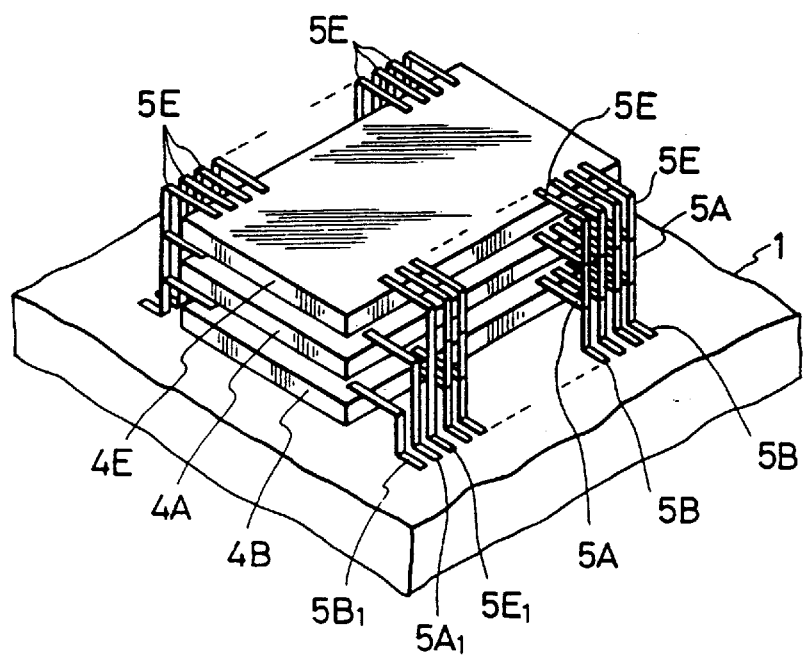
FIG. 4 is a perspective view of a part of a module base plate (indicated at numeral 1) for explaining a modification to Example 1 of Embodiment 1.

FIG. 4 is a perspective view of a part of the module base plate 1 for explaining the modification of Example I of Embodiment 1. As shown in FIG. 4, a further semiconductor chip 4E may well be stacked over the semiconductor chip 4A. Symbol 5E denotes the leads of the semiconductor chip 4E, which are connected to the leads 5A. In this regard, the lead $5E_1$ for inputting a chip select signal to the semiconductor chip 4E is not connected with the lead $5A_1$ or $5B_1$, but it is connected to the lead 3A of the decoder 3 different from the leads 3A to which the leads $5A_1$ and $5B_1$ are respectively connected. Although the rear surface of the module base plate 1 is not illustrated, the semiconductor chip 4D is similarly overlaid with a further semiconductor chip on the rear surface so as to form the three-layered structure.

EXAMPLE II

Figure 5:
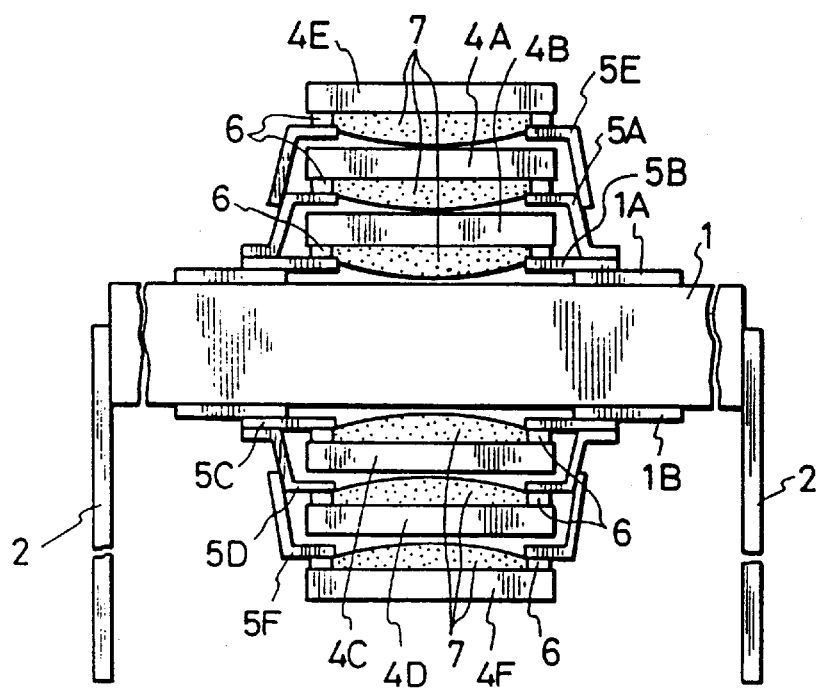
FIG. 5 is a front view of a semiconductor device in Example II of Embodiment 1 of the present invention.

FIG. 5 is a front view of a semiconductor device in Example II of Embodiment 1 of the present invention.

Referring to FIG. 5, symbol 1A denotes a connection terminal on the front surface of the module base plate 1, and symbol 1B a connection terminal on the rear surface thereof. In this example, three semiconductor chips 4B, 4A and 4E constitute one set, and four such sets are arranged on the front surface of the module base plate 1. Likewise, four sets each consisting of three semiconductor chips 4C, 4D and 4F are arranged on the rear surface of the module base plate 1.

In Example II, the principal surface of each of the semiconductor chips 4B, 4A, 4E, 4C, 4D and 4F, namely, the surface thereof which is provided with semiconductor elements and wiring and which is covered with a resin 7, is confronted to the module base plate 1, thereby to shorten leads 5A, 5B, 5E, 5C, 5D and 5F.

EXAMPLE III

Figure 6:
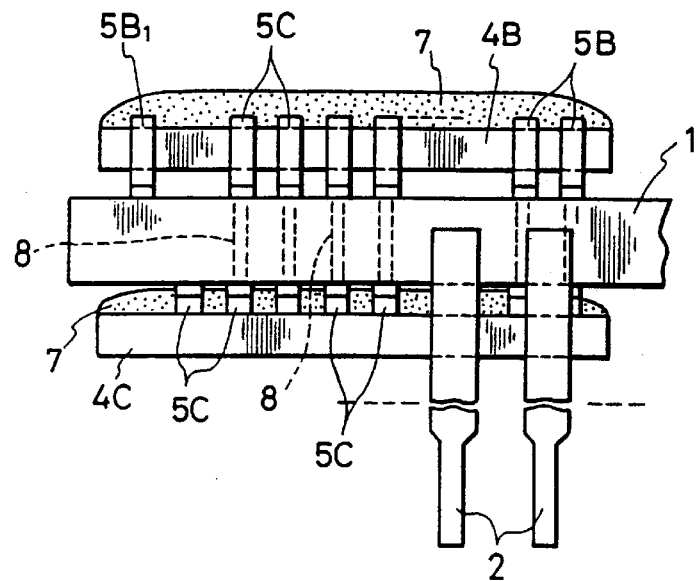
FIG. 6 is a side view of a semiconductor device in Example III of Embodiment 1 of the present invention.
Figure 7:
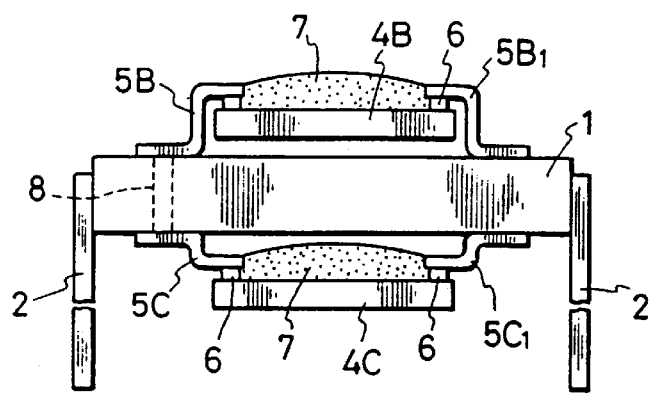
FIG. 7 is a front view of the semiconductor device in FIG. 6.

FIG. 6 is a side view of a semiconductor device in Example III of Embodiment 1 of the present invention, and FIG. 7 is a front view of the semiconductor device.

Example III of Embodiment I of the present invention is such that a semiconductor chip 4B installed on the front surface of a module base plate 1 has its rear surface confronted to the module base plate 1, while a semiconductor chip 4C installed on the rear surface of the module base plate 1 has its principal surface confronted to the module base plate 1. In this way, when the semiconductor device is viewed from the side of the semiconductor chip 4B, the leads 5B of the semiconductor chip 4B and those 5C of the semiconductor chip 4C having the same functions coincide in projection. The respectively coincident leads 5B and 5C of the same functions are connected by the penetrating wiring (through-hole wiring) 8 of the module base plate 1. That is, each lead 5B is connected to the corresponding lead 5C having the same function as that of this lead 5B by the penetrating wiring 8. Thus, by way of example, the lead 5B for inputting an address signal to the semiconductor chip 4B is connected through the penetrating wiring 8 to the lead 5C for inputting an address signal to the semiconductor chip 4C. Likewise, the lead 5B which serves as an input/output terminal for the data of the semiconductor chip 4B is connected through the penetrating wiring 8 to the lead 5C which serves as an input/output terminal for the data of the semiconductor chip 4C. In this regard, the lead $5B_1$ for inputting the chip select signal of the semiconductor chip 4B and the lead $5C_1$ for inputting the chip select signal of the semiconductor chip 4C are not connected by the penetrating wiring 8, but the lead $5B_1$ is connected to a decoder 3 disposed on the front surface of the module base plate 1, while the lead $5C_1$ is connected to a decoder 3 on the rear surface of the module base plate 1. Here, the module base plate 1 in the present example has a single-layer structure which is made of a resin, for example, glass epoxy, and inside which any wiring other than the penetrating wiring 8 is not provided. On the front and rear surfaces of the module base plate 1, however, there are laid wiring for connecting the semiconductor chips 4B, 4C and leads 2, wiring for connecting the decoders 3 (not shown in FIGS. 6 and 7) and the semiconductor chips 4B, 4C, and so forth. The penetrating wiring leads 8 are formed in such a way that through holes are provided in the module base plate 1 by, for example, a drill and are thereafter plated with, for example, copper layers by, for example, evaporation or electroless plating.

As described above, the leads 5B and 5C of the same functions are connected by the penetrating wiring 8, whereby the module base plate 1 is constructed into the single-layer structure inside which no wiring other than the penetrating wiring 8 is provided, so that the reliability of the module base plate 1 can be enhanced.

Moreover, since the leads 5B and 5C of the same functions are connected by the penetrating wiring 8, the number of the wiring leads to be laid on the front and rear surfaces of the module base plate 1 can be decreased.

Incidentally, the module base plate 1 with the penetrating wiring 8 may well be formed of laminated ceramic. In this case, the wiring for connecting the semiconductor chips 4B, 4C and the leads 2, the wiring for connecting the semiconductor chips 4B, 4C and the decoders 3, etc. are buried in the module base plate 1. Owing to the provision of the penetrating wiring 8, however, it suffices to lay, for example, only the wiring for connecting the semiconductor chip 4B on the front surface of the module base plate 1 to the leads 2 and the decoder 3, so that the number of the wiring leads to be buried can be sharply decreased. Accordingly, the reliability of the module base plate 1 can be heightened.

EXAMPLE IV

Figure 8:
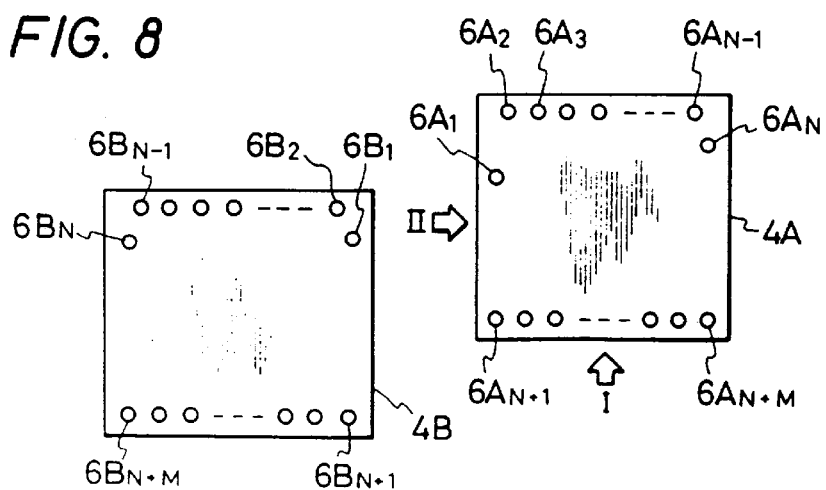
FIG. 8 is a plan view of two semiconductor chips in Example IV of Embodiment 1 of the present invention.
Figure 9:
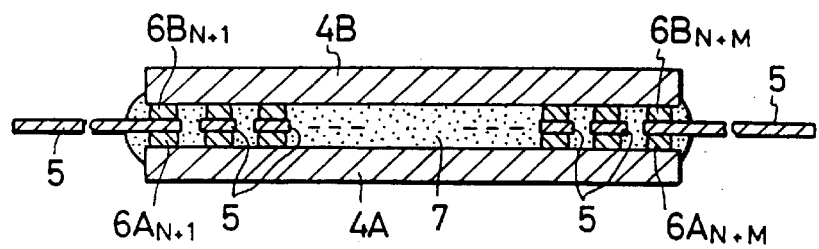
FIG. 9 is a side view in which the two semiconductor chips shown in FIG. 8 as confronted to each other and then connected to the same leads are seen in a direction I indicated in FIG. 8.
Figure 10:
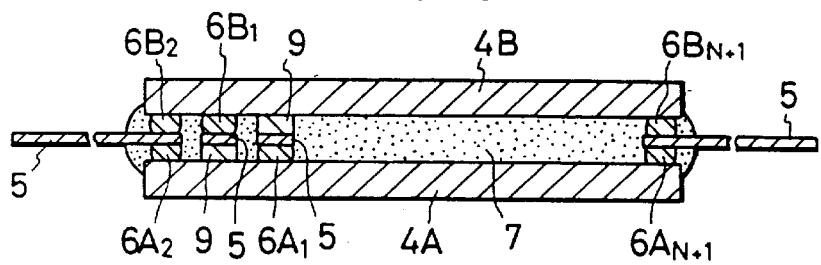
FIG. 10 is a side view in which the two semiconductor chips connected to the same leads are seen in a direction II indicated in FIG. 8.

FIG. 8 is a plan view of two semiconductor chips in Example IV of Embodiment 1 of the present invention;

FIG. 9 is a side view in which the two semiconductor chips shown in FIG. 8 are confronted to each other and connected to the same leads, and they are seen in a direction I indicated in FIG. 8; and FIG. 10 is a side view in which the two semiconductor chips connected to the same leads are seen in a direction II indicated in FIG. 8.

Example IV of Embodiment 1 of the present invention is such that, in a semiconductor chip 4A, bump electrodes 6A are successively arranged from the upper left corner of this chip, while in a semiconductor chip 4B, bump electrodes 6B having the same functions as those of the bump electrodes 6A are arranged from the upper right corner of this chip. More specifically, in the bump electrodes $6A_2, \ldots, 6A_{N-1}, 6A_N, 6A_{N+1}, \ldots$ and $6A_{N+M}$ of the semiconductor chip 4A and the bump electrodes $6B_2, \ldots, 6B_{N-1}, 6B_N, 6B_{N+1}, \ldots$ and $6B_{N+M}$ of the semiconductor chip 4B, ones having the same subscripts are the bump electrodes of the same functions. The bump electrodes 6A and 6B are symmetrically arranged so that, when the semiconductor chips 4A and 4B are stacked with their principal surfaces confronted to each other, the bump electrodes $6B_2, \ldots, 6B_{N-1}, 6B_N, 6B_{N+1}, \ldots$ and $6B_{N+M}$ of the semiconductor chip 4B may overlie those $6A_2, \ldots, 6A_{N-1}, 6A_N, 6A_{N+1}, \ldots$ and $6A_{N+M}$ of the semiconductor chip 4A, respectively. These bump electrodes 6A and 6B symmetrically arranged are connected to the same leads 5. However, the bump electrode $6A_1$ for inputting the chip select signal of the semiconductor chip 4A and the bump electrode $6B_1$ for inputting the chip select signal of the semiconductor chip 4B are dislocated so as not to coincide, and are connected to the separate leads 5. An insulator member 9 insulates the lead 5 to which the bump electrode $6A_1$ is connected, from the semiconductor chip 4B, while another insulator member 9 insulates the lead 5 to which the bump electrode $6B_1$ is connected, from the semiconductor chip 4A. After semiconductor chips 4A and 4B have been confronted to each other and connected to the leads 5, the leads 5 are formed into appropriate shapes for mounting to the module base plate 1. Subsequently, a plurality of sets each consisting of the semiconductor chip 4A and the semiconductor chip 4B are arranged on each of the front and rear surfaces of a module base plate 1.

As described above, the bump electrodes 6A and 6B are arranged symmetrically and are connected to the same leads 5, whereby the density of installation of the semiconductor chips 4A and 4B on the module base plate 1 can be doubled.

Figure 11:
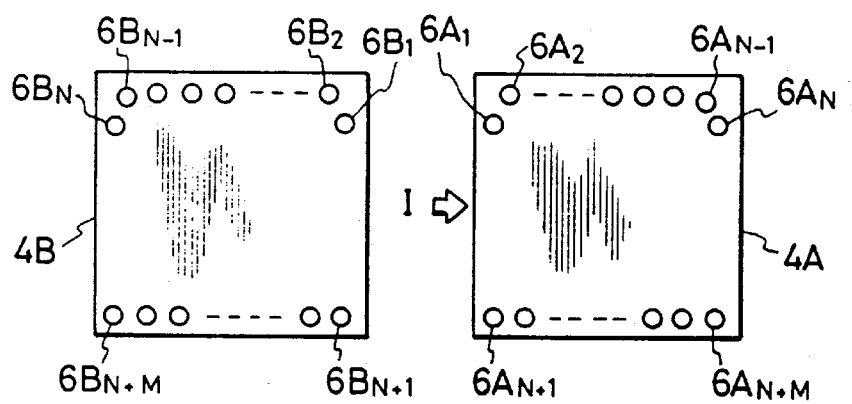
FIG. 11 is a plan view of two semiconductor chips (4A and 4B) which are to be stacked over each other.
Figure 12:
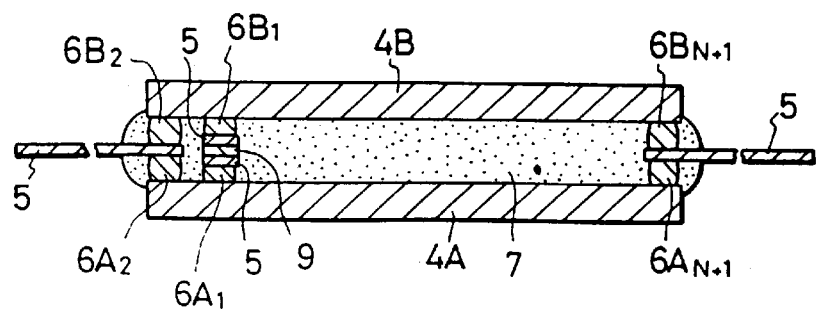
FIG. 12 is a side view in which the semiconductor chips (4A, 4B) confronted to each other and then connected to the same leads (5) are seen in the direction I of the semiconductor chip (4A) indicated in FIG. 11.

As illustrated in FIGS. 11 and 12, it is also allowed to arrange the bump electrode $6A_1$ of the semiconductor chip 4A and the bump electrode $6B_1$ of the semiconductor chip 4B at symmetric positions so that they may coincide in projection when the semiconductor chip 4B is stacked over the semiconductor chip 4A. In this regard, the lead 5 to which the bump electrode $6A_1$ is connected and the lead 5 to which the bump electrode $6B_1$ is connected are stacked, but they are insulated by the insulator member 9. For reference, FIG. 11 is a plan view of the two semiconductor chips 4A and 4B to be stacked, while FIG. 12 is a side view in which the semiconductor chips 4A and 4B are confronted to each other and connected to the same leads 5, and they are seen in the direction I of the semiconductor chip 4A indicated in FIG. 11.

Although, in the above, this embodiment has been concretely described in conjunction with the examples, it is a matter of course that the present invention is not restricted to the foregoing examples, but that it can be variously altered within a scope not departing from the purport thereof.

An effect which is attained by a typical aspect of performance of the present invention will be briefly described below:

A semiconductor device is constructed in such a way that a plurality of semiconductor chips to which leads are connected by the TAB without encapsulation in packages are mounted on a module base plate, whereby the area which the single semiconductor chip occupies on the module base plate can be reduced, and hence, a larger number of semiconductor chips can be mounted on the module base plate. That is, the packaging density of the semiconductor device can be increased.

(2) Embodiment 2

Next, Embodiment 2 of the present invention will be described with reference to the drawings.

FIGS. 13(A)–13(C) are principle diagrams showing Embodiment 2 of the present invention. A plastic film tape is provided with device holes 101, and lead patterns 102 formed on the film tape are partly protruded into the device holes 101. In FIG. 13(A), the lead 102a of the lead pattern 102 situated at the upper right end of the figure extends in parallel with the remaining leads 102b, whereas in FIG. 13(B), the lead 102a of the lead pattern 102 situated at the upper right end of the figure is in a shape bent at a right angle. A semiconductor chip, not shown, is assembled in each device hole 101. In FIG. 13(A), the lead 102a at the upper right end of the figure serves as a lead for the chip select signal of the semiconductor chip assembled in the device hole 101, while in FIG. 13(B), the right-angled bent lead 102a at the upper right end serves similarly as a lead for the chip select signal of the corresponding semiconductor chip.

FIG. 13(C) conceptually illustrates the stacked and installed state of tape carriers in which the leads 102a of the respective lead patterns 102 are made different as described above. The lead 102a at the upper right end of this figure governs the input/output of the chip select signal of the upper chip installed in the stack arrangement. In addition, the lead 102a adjoining the aforementioned lead 102a governs the input/output of the chip select signal of the lower chip installed in the stack arrangement.

Figure 14:
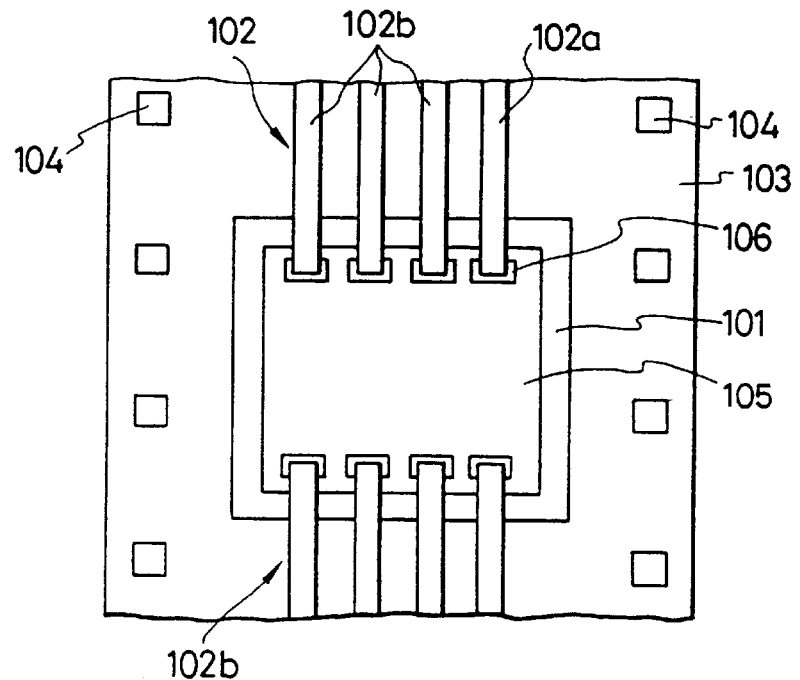
FIG. 14 is a plan view of essential portions showing Embodiment 2 of the present invention.
Figure 15:
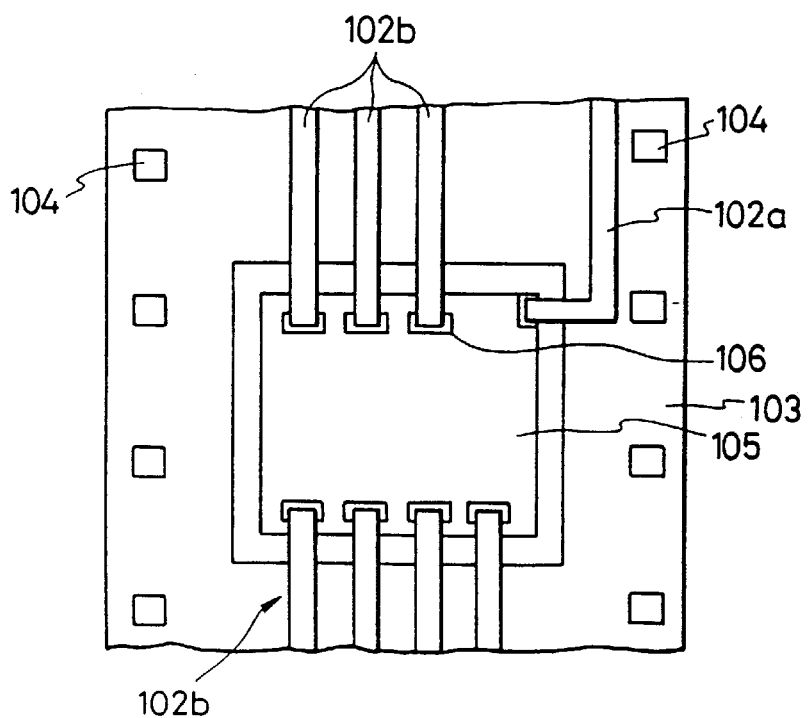
FIG. 15 is a plan view of essential portions showing Embodiment 2 of the present invention.

The other leads 102b serve as input/output terminals which are common to both the chips. FIG. 14 shows the details of the tape carrier in FIG. 13(A), while FIG. 15 shows the details of the tape carrier in FIG. 13(B).

As shown in these figures, a plurality of sprocket holes 104 for feeding and positioning the plastic film tape 103 are provided at suitable intervals in each of both the side end parts of the tape 103, and the device holes 101 for assembling the semiconductor chips 5 are provided in the central parts of the tape 103. As illustrated in the figures, the chips 105 are joined to the fore end parts of the lead patterns 102 protruded into the device holes 101, by face-down bonding (gang bonding).

Figure 16:
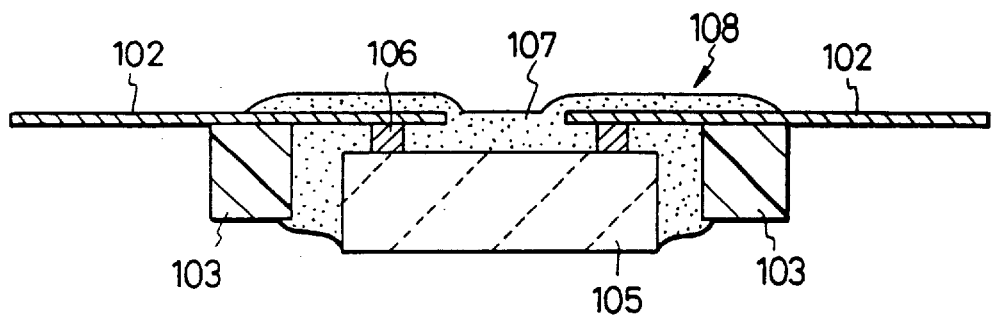
FIG. 16 is a sectional view showing Embodiment 2 of the present invention.

The joining operation is carried out by thermocompression by forming bumps 106 at the electrode portions of each chip 105, but it may well be similarly done by forming bumps 106 on the side of the lead pattern 102. After the bonding (inner lead bonding) of the chip 105, a resin mold member 107 is formed by potting with a molding resin as shown in a sectional view of FIG. 16, whereby the chip 105 is sealed.

Figure 17:
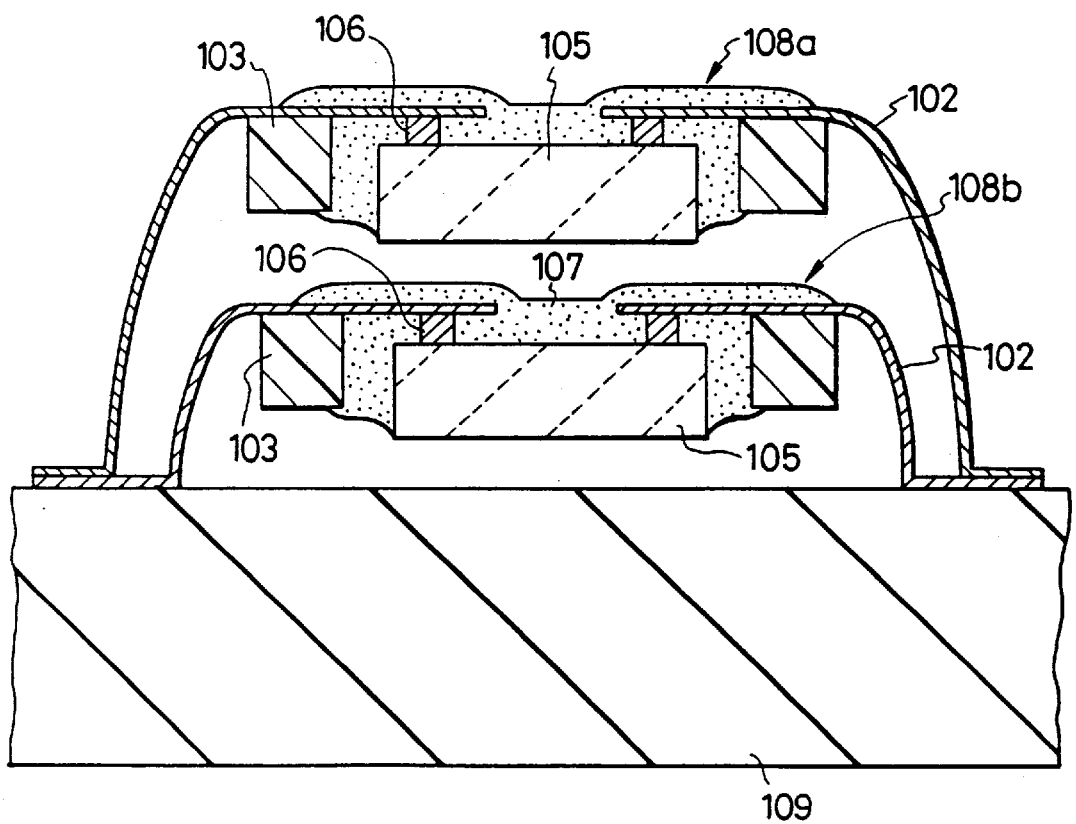
FIG. 17 is a sectional view showing Embodiment 2 of the present invention.

Tape carrier packages 108 thus molded are arranged in a stack installed on a mounting base plate 109 as shown in a sectional view of FIG. 17. In FIG. 17, an upper tape carrier package 108a is the tape carrier package having the lead pattern 102 shown in FIG. 13(A), and a lower tape carrier package 108b is the tape carrier package having the lead pattern 102 shown in FIG. 13(B).

The plastic film tape for use in the present invention is constructed of, for example, a polyimide type resin film which has been slitted into a proper width. The lead patterns 102 can be formed by laminating the film tape with, for example, a copper foil and processing the copper foil with a photoresist technique as well as an etching technique. The partial layouts of the lead patterns 102 are made different in accordance with the respective tape carrier packages 108a and 108b.

Each semiconductor chip 105 includes, for example, a silicon single-crystal substrate with a large number of circuit elements formed within the chip by well-known techniques so as to endow the chip with one circuit function. Concretely, the circuit elements are, for example, MOS transistors, and the circuit function of, for example, a logic circuit or a memory is afforded by these circuit elements.

The bumps 106 are made of, for example, gold (Au).

The potting resin which is used for the molding is, for example, a potting liquid whose principal component is an epoxy resin.

The mounting base plate 109 is, for example, a printed-wiring circuit board.

According to the present invention, as indicated in the embodiment, the leads 102a which are the parts of the respective lead patterns 102 are made different, thereby permitting the two tape carrier packages 108a and 108b to be stackedly installed on the mounting base plate 109. Thus, the density of installation can be made higher than in an assumed case where the tape carrier packages 108a and 108b are juxtaposed on the mounting base plate 109. Furthermore, in the case of juxtaposing the tape carrier packages 108a and 108b, wiring becomes long and complicated, whereas according to the invention, wiring is short and is simplified, and the rate of the breaking of the wiring lessens, which is greatly contributive to the enhancement of reliability.

Although, in the above, the invention made by the inventors has been concretely described in conjunction with the embodiment, it is a matter of course that the present invention is not restricted to the foregoing embodiment, but that it can be variously altered within a scope not departing from the purport thereof.

By way of example, the embodiment has been exemplified as stacking and installing the two tape carrier packages on the mounting base plate, but three or more tape carrier packages can be stacked. In some cases, tape carrier packages can be stacked and installed on each of both the surfaces of the mounting base plate.

An effect which is attained by a typical aspect of peformance of the present invention will be briefly described below:

According to the present invention, high-density packaging is realized with a tape carrier, and a semiconductor device which is advantageous for wiring and which has an enhanced reliability can be provided.

(3) Embodiment 3

The present embodiment concerns modifications corresponding to Embodiments 1 and 2 described before, and teaches further practicable examples.

Figure 18:
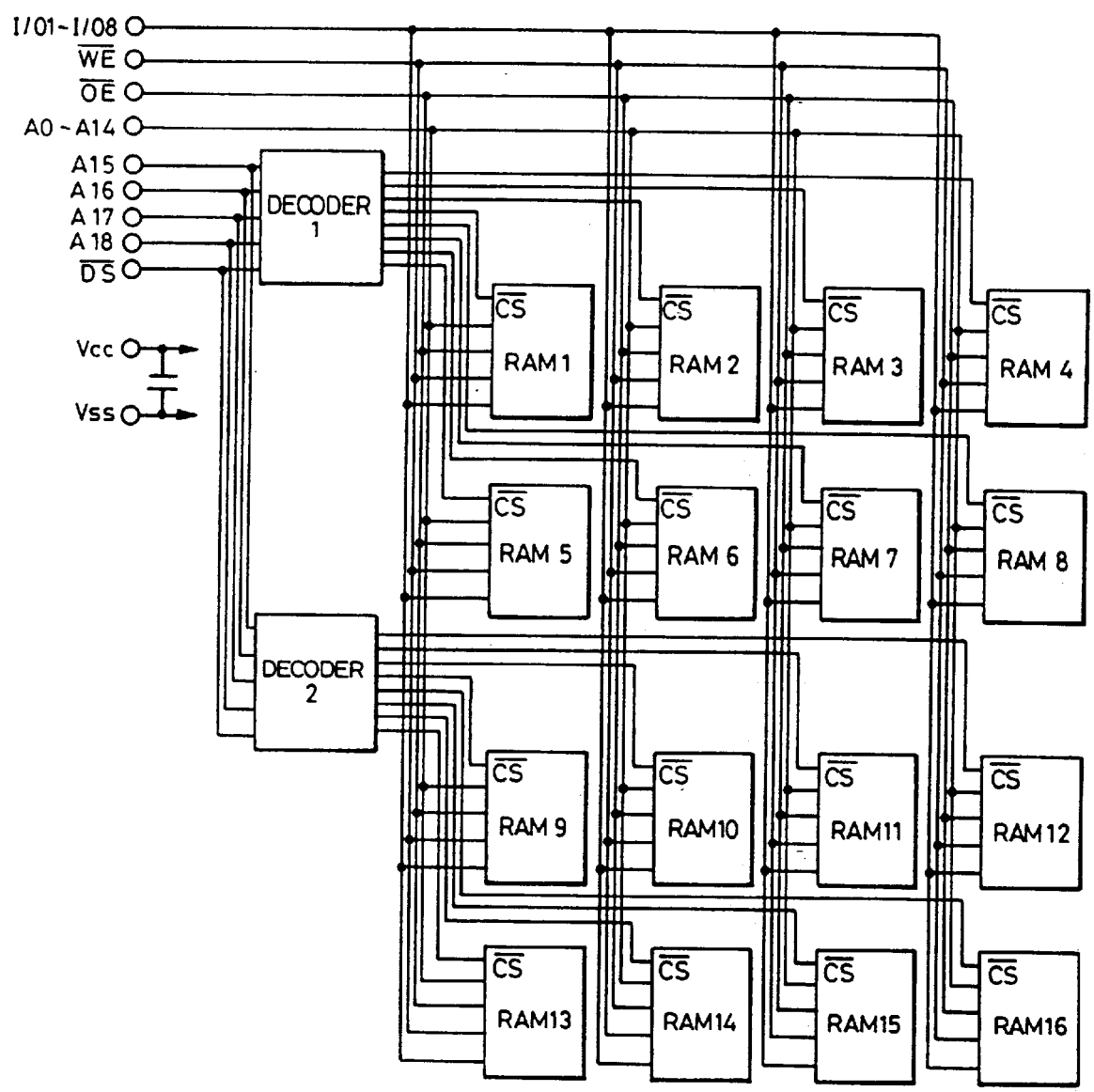
FIG. 18 is a circuit block diagram showing the general system of memory modules according to the present invention.

FIG. 18 is a circuit diagram of the general system of memory modules in the present embodiment. Referring to the figure, each of RAM1–RAM16 is the MOS type or BIMOS (bipolar-MOS) type integrated circuit chip of a 256-kilobit SRAM (static random access memory), and it has a chip select terminal CS. Each of decoders 1 and 2 is a resin-encapsulated dual in-line type device for a decoder integrated circuit. Symbols I/O1–I/O8 denote data input/output pins, and symbols A0–A18 denote address input pins. Shown at $\overline{WE}$, $\overline{OE}$ and $\overline{DS}$ are a series of control pins. Among them, the pin $\overline{WE}$ is a write enable pin, and the pin $\overline{OE}$ is an output enable pin. The pin $\overline{DS}$ is usually termed the "pin" $\overline{CS}$ but it differs in function from the $\overline{CS}$ terminal of the the RAM chip mentioned before. This terminal DS determines either of the upper and lower decoders to be selected, in accordance with an input "0" or "1." Terminals $V_{cc}$ and $V_{ss}$ are power source terminals in a broad sense, and in particular, the terminal $V_{cc}$ is called a "supply voltage terminal," while the terminal $V_{ss}$ is called a "reference voltage terminal." A voltage of 5 [V] is fed to the terminal $V_{cc}$, and a voltage of 0 [V] to the terminal $V_{ss}$.

Figure 19:
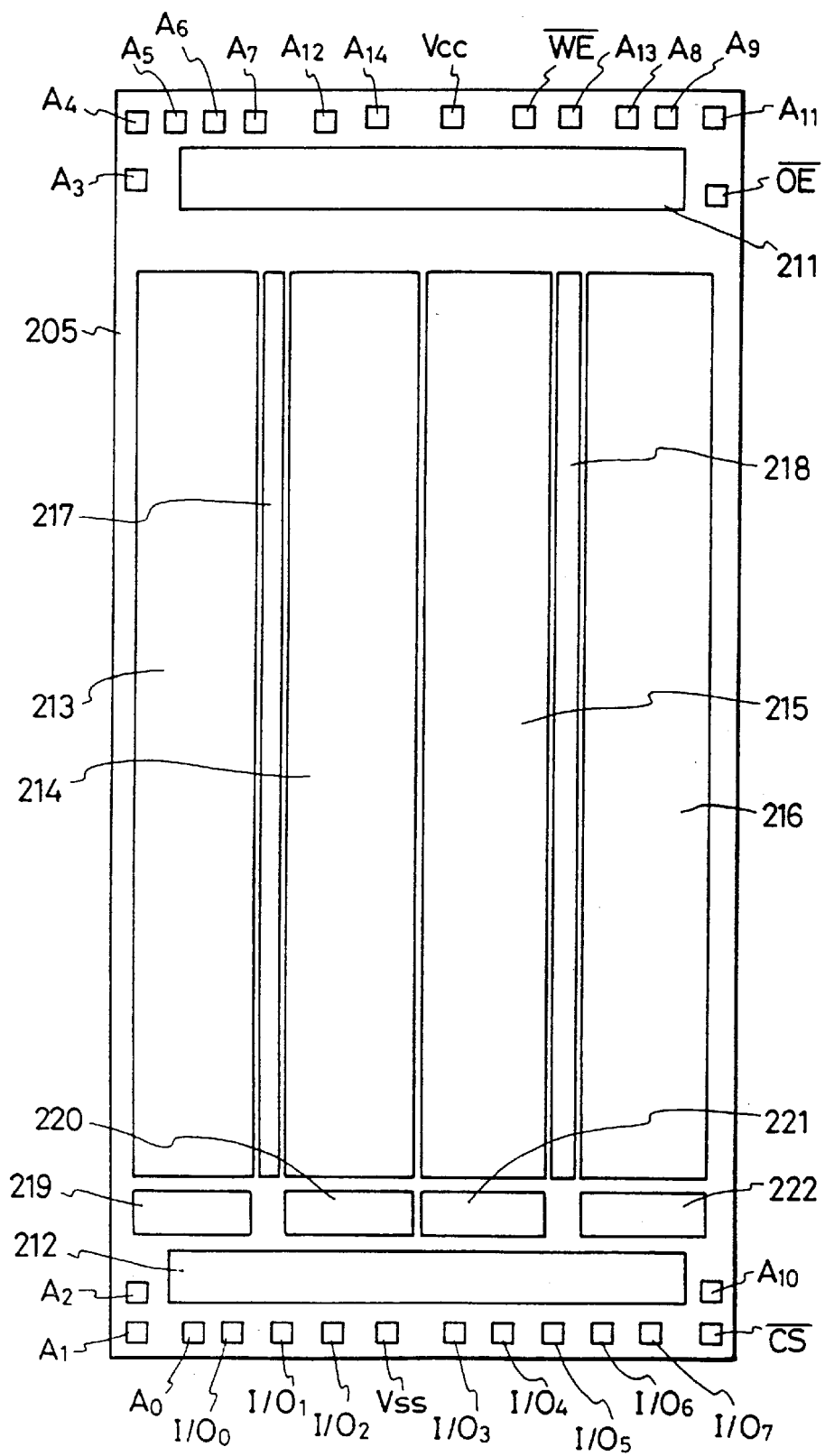
FIG. 19 is a layout plan of circuits and bonding pads on the first principal surface of an SRAM (static random access memory) chip in the multiple chip complex of the present invention.

FIG. 19 shows the layout of the first principal surface of each of the memory chips RAM1–RAM16. Referring to the figure, the first principal surface is provided with address input pads $A_0$–$A_{14}$, input/output pads I/O$_0$–I/O$_7$, a write enable pad $\overline{WE}$, an output enable pad $\overline{OE}$, a chip select pad $\overline{CS}$, a supply voltage pad $V_{cc}$, a reference voltage pad $V_{ss}$, peripheral circuit blocks 211 and 212 such as an address buffer and an I/O buffer, memory mats 213–216 each of which includes 4-transistor MOS-type SRAM cells each having a high-resistance polycrystalline silicon load, X-group circuit blocks 217–218 such as row decoders, and Y-group circuit blocks 219–222 which include column decoders and sense amplifiers and which correspond to the memory mats 213–216 respectively. Numeral 205 indicates an Si single-crystal substrate.

Figure 20:
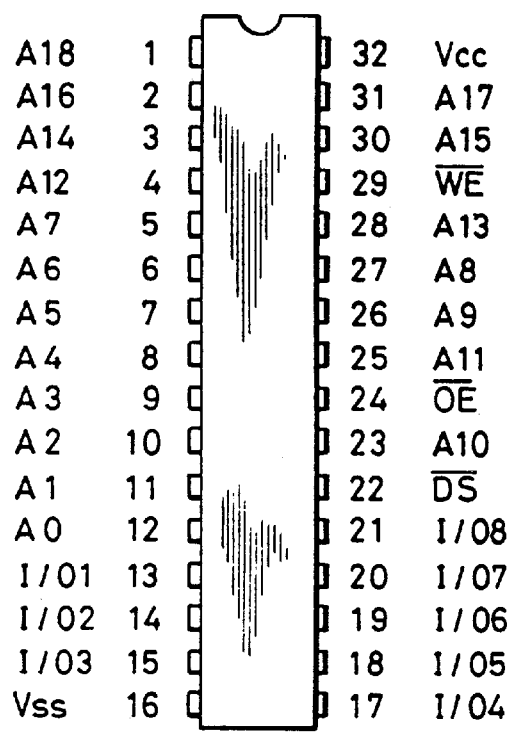
FIG. 20 is a layout plan of the pins of the memory module of the present invention.

FIG. 20 shows the pin arrangement of the memory modules corresponding to the general layout stated before.

Figure 21C:
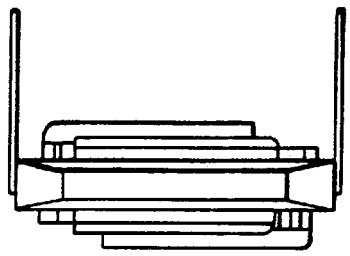
FIGS. 21(a), 21(b) and 21(c) are a top view, a front view and a side view showing the exterior appearance of the memory module of the present invention, respectively.
Figure 21A:
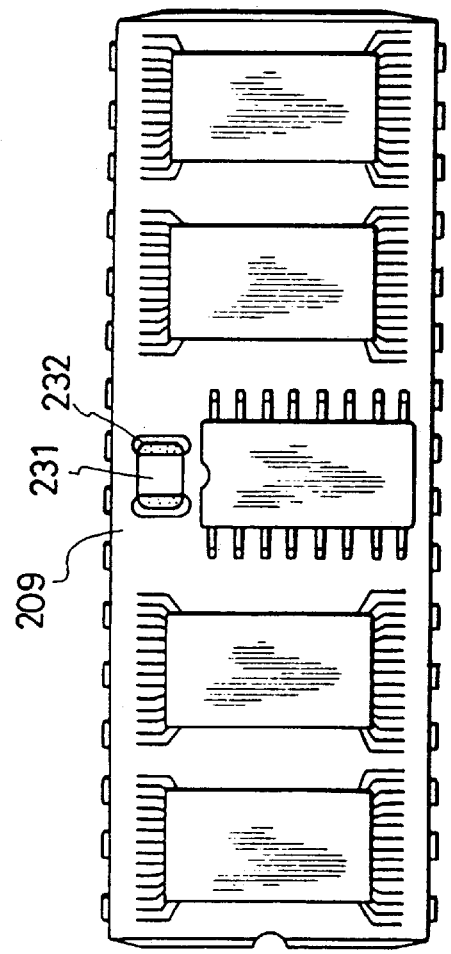
Figure 21B:
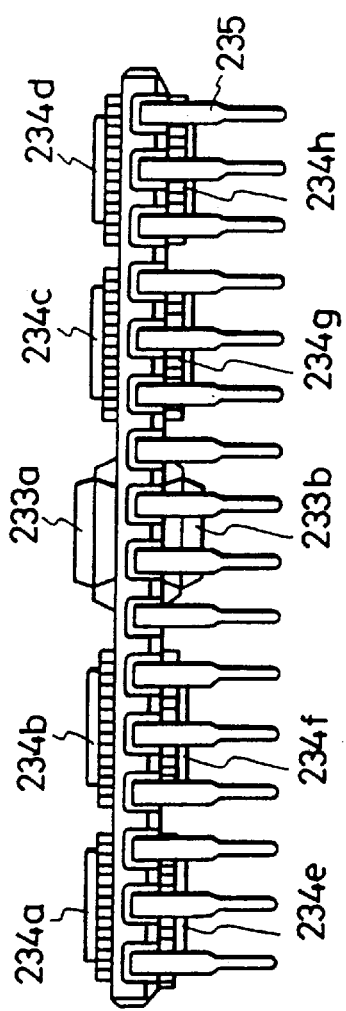

FIGS. 21(a), 21(b) and 21(c) are a top view, a front view and a side view of the memory modules, respectively. Referring to the figures, numeral 209 indicates a laminated ceramic base plate, numeral 231 a chip capacitor which is connected across the terminals $V_{cc}$ and $V_{ss}$ in FIG. 18, and numeral 232 a foot print or soldering pad for the chip capacitor. Symbols 233a and 233b denote decoder ICs which correspond to decoders 1 and 2 in FIG. 18, respectively. A memory chip complex 234a corresponds to the RAM1 and RAM5 in FIG. 18, and a chip complex 234b similarly corresponds to the RAM2 and RAM6. Complexes 234c and 234d are similar. Further, a chip complex 234e similarly correspodns to the RAM9 and RAM13, and complexes 234f–234h are similar to the above. Metal leads 235 are brazed to metallized pads on the side surfaces of the ceramic base plate, and they correspond to the respective pins in FIG. 20.

Figure 22:
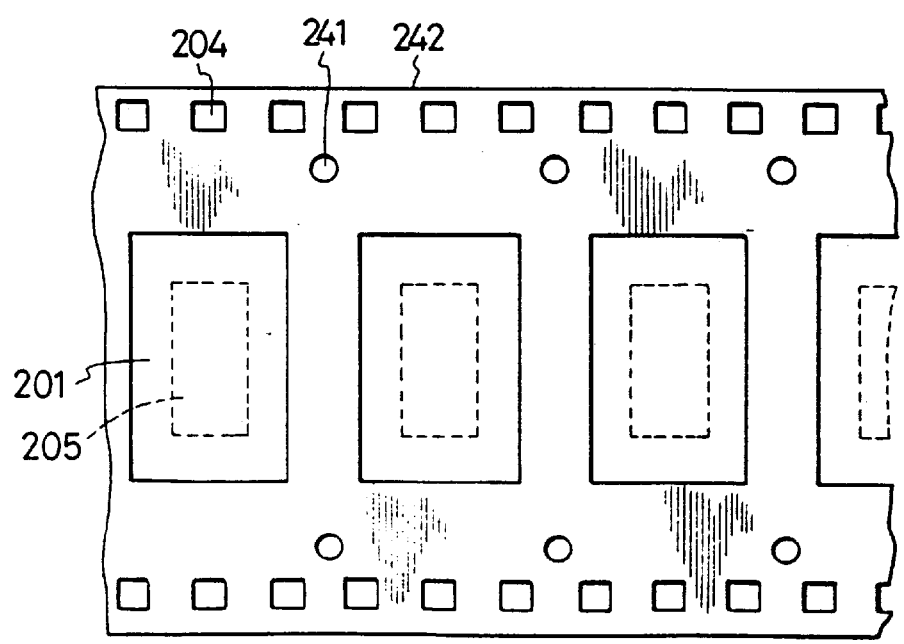
FIG. 22 is a plan view showing the larger-area property of a tape carrier in the present invention.

FIG. 22 shows a polyimide tape which is used for the manufacturing method of the present invention. Referring to the figure, numeral 201 designates a device mounting hole (device hole) or perforation, numeral 205 the mounted position of an Si chip (memory chip), numeral 204 a sprocket hole for the automatic feed or positioning of the carrier tape, numeral 241 an isolation hole for isolating common copper wiring on the carrier tape into the wiring of each unit tape portion, and numeral 242 the carrier tape in which a copper sheet laminated with a polyimide sheet is processed into predetermined patterns by photolithography.

Figure 23:
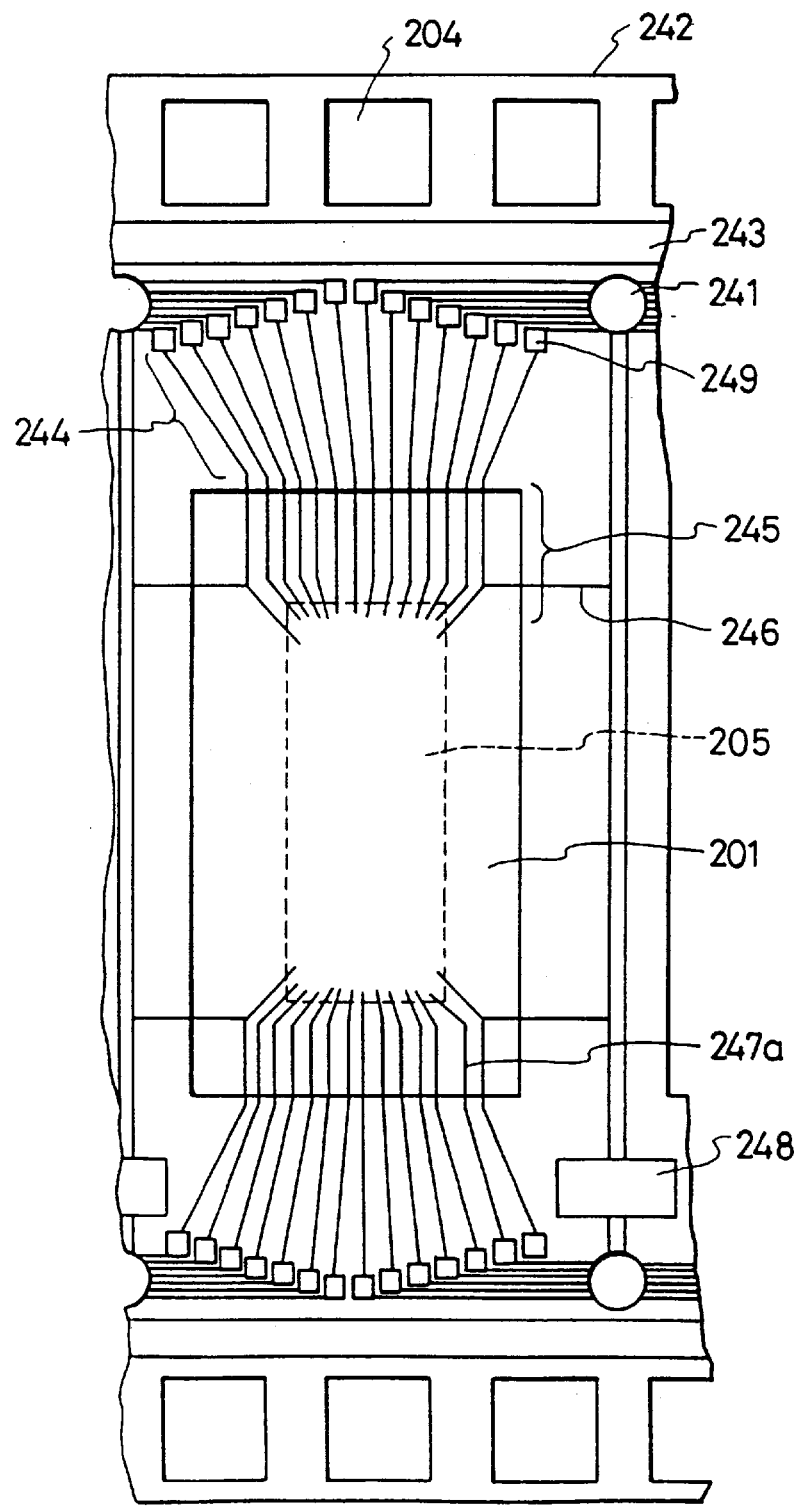
FIGS. 23 and 24 are top views of the unit portions of tape carriers (upper stage TAB, lower stage TAB) in the present invention, respectively.

FIG. 23 is an enlarged view of the unit portion of an upper tape corresponding to FIG. 22, for mounting the RAM1–RAM4 and RAM9–RAM12 in FIG. 18, in other wrods, upper chips. Referring to FIG. 23, the upper tape unit is provided with a device hole 201, sprocket holes 204, isolation holes 241, broader copper belts 243, copper leads 244 disposed on the carrier tape 242, outer lead and inner lead regions 245 made of copper sheets, support leads 246 which extend on the tape and into the device hole and which hold the leads at end parts, a copper lead for $\overline{CS}$ at 247a, a copper plate 248, and copper pads for tests at 249, which are provided in a number of 14 on each of both the sides of the tape. The other straight or bent fine lines indicate copper wiring patterns. Numeral 205 indicates a chip mounting position.

Figure 24:
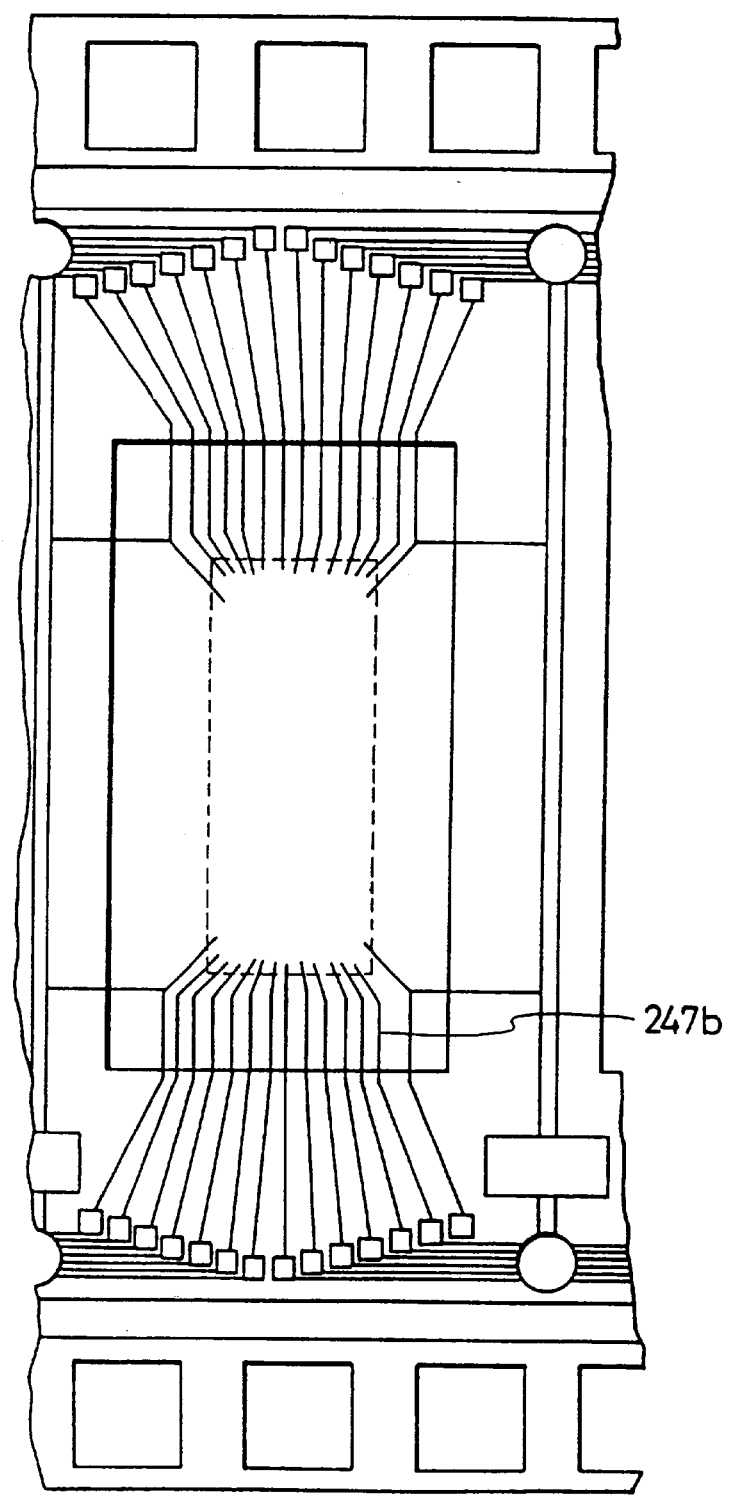

FIG. 24 is an enlarged view of the unit portion of a lower tape corresponding to FIG. 22, for mounting the RAM5–RAM8 and RAM13–RAM16 in FIG. 18, in other words, lower chips. In FIG. 24, symbol 247b denotes a copper lead for $\overline{CS}$, and the other patterns are quite the same as in FIG. 23.

FIGS. 25–28 show the flow of a process for forming the bump electrode on the memory chip. Referring to the figures, numeral 205 designates a Si single-crystal substrate, numeral 251 a subbing inorganic insulator film which includes inter-layer insulator films such as a first passivation film of thermal oxidation $SiO_2$ and a second passivation film of PSG (phosphosilicate glass), numeral 254 an Al bonding pad which is formed by patterning the same Al film as an Al layer for the internal interconnection of the memory chip, numeral 252 a final passivation film made of $SiO_2$ or $S_3N_4$, and numeral 253 a resin layer made of PIQ (polyimide isoindoloquinazolinedione). Numeral 255 indicates an underlying metal layer which is made of Ti (titanium), and numeral 256 another underlying metal layer which is made of Pd (palladium). Numeral 257 indicates a bump forming photoresist layer, which is used for forming an Au (gold) bump 258.

Figure 28:
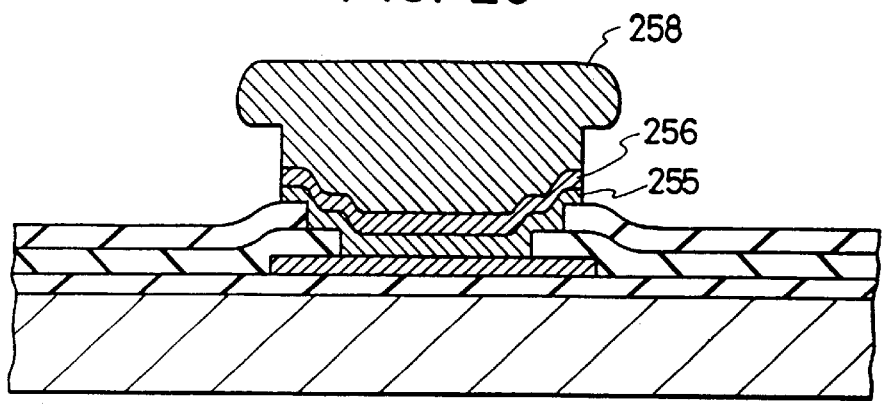
Figure 29:
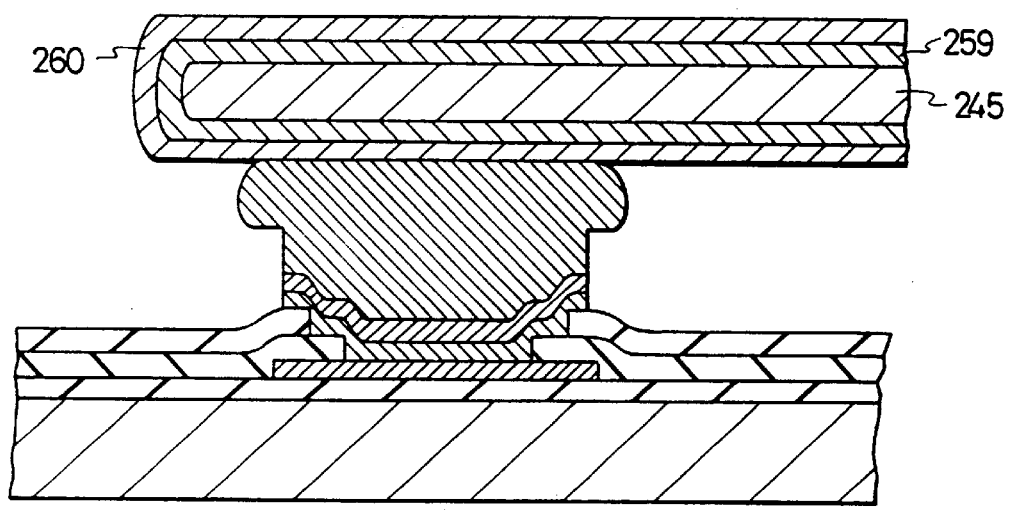
FIG. 29 is an enlarged sectional view of essential portions showing the gang-bonded state between the lead of the tape carrier and the bump electrode of the chip.

FIG. 29 is a sectional view showing the state in which the above bump in FIG. 28 and the inner lead in FIG. 23 or FIG. 24 are gang-bonded. In FIG. 29, numeral 245 indicates the fore end part of the copper inner lead, numeral 259 an Ni (nickel) plating layer, and numeral 260 an Au (gold) plating layer.

Figure 30:
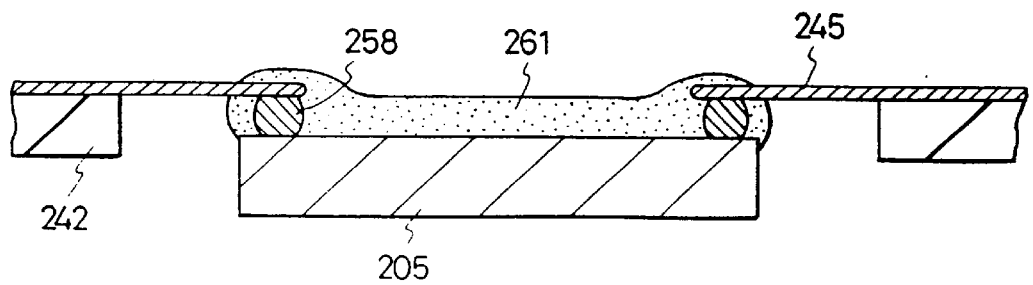
FIG. 30 is a sectional view showing the joined situation of the carrier tape and the chip and the coating state of a potting resin.

FIG. 30 is a sectional view in which the chip in the state of FIG. 29 as potted with a molding resin material over substantially the whole principal surface thereof is shown in relation to the surrounding carrier tape. Referring to FIG. 30, numeral 205 indicates the memory chip, numeral 242 the inner end of the device hole side of the carrier tape, numeral 245 an outer lead portion (Cu film), numeral 258 the Au bump, and numeral 261 a molding resin layer (epoxy type resin).

Figure 31:
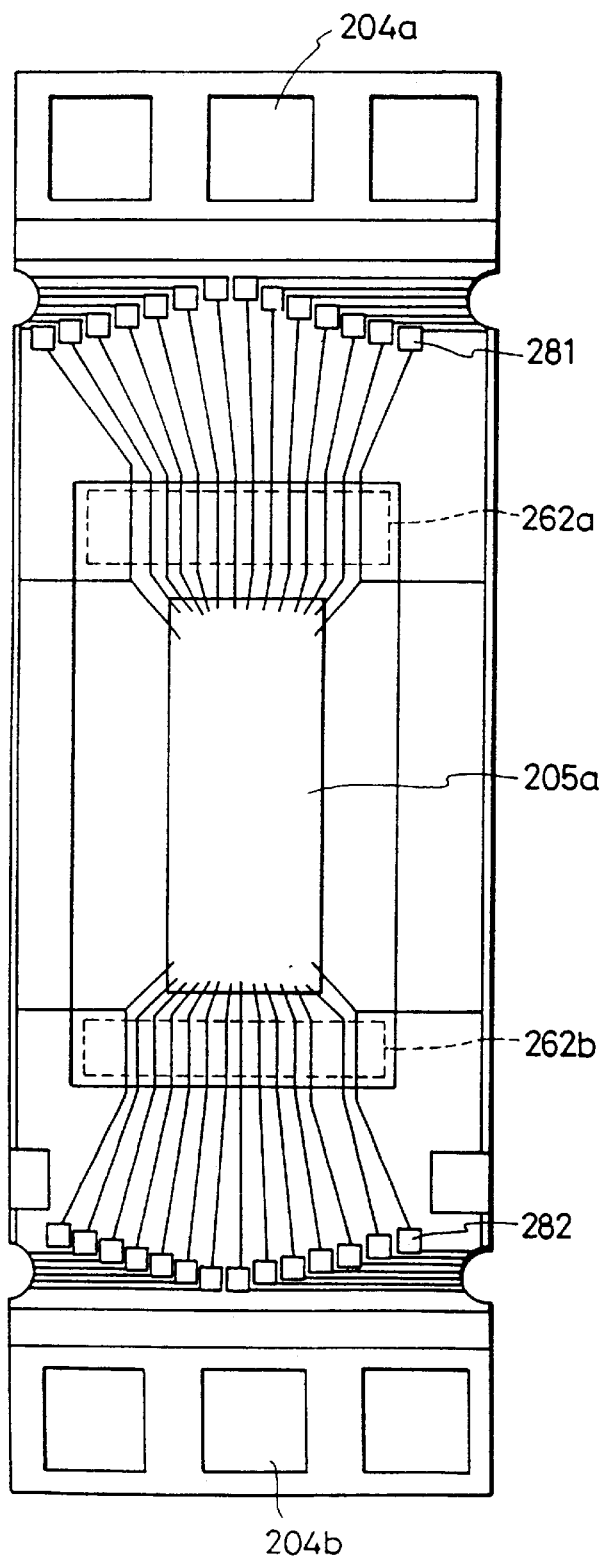
FIG. 31 is a top view showing the upper stage TAB separated into the unit portion.

FIG. 31 is a plan view of the tape carrier (upper side) divided into the individual unit portion at the stage of FIG. 29. In FIG. 31, numerals 281 and 282 indicate Cu test pads which are provided in the number of 14 on the corresponding sides of the carrier tape, symbols 204a and 204b denote sprocket holes, symbol 205a denotes the first principal surface of the upper chip corresponding to the, RAM1–RAM4 and RAM9–RAM12 in FIG. 18, and symbols 262a and 262b denote joining regions or pressed connection regions for forming a complex together with a lower carrier tape.

Figure 32:
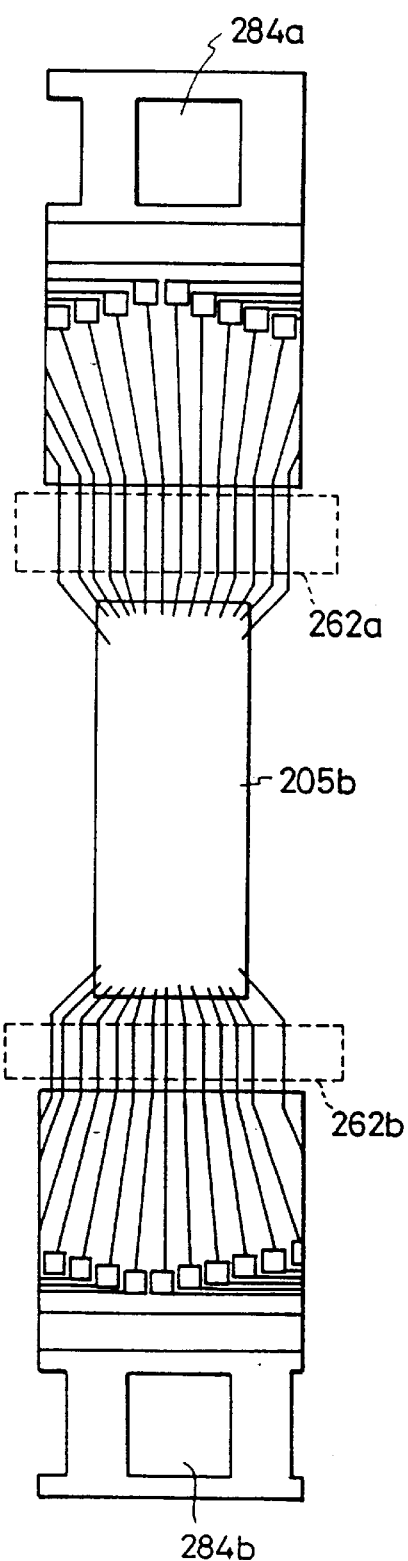
FIG. 32 is a top view showing the lower stage TAB separated so as to leave essential parts in the unit portion.

FIG. 32 is a top view showing the state in which the lower carrier tape corresponding to FIG. 31 is separated so as to leave only the necessary parts of the unit portion thereof. In FIG. 32, symbol 205b denotes the upper (first) principal surface of the lower chip corresponding to the RAM5–RAM8 and RAM13–RAM16 in FIG. 18, symbols 262a and 262b denote upper and lower lead joining regions in which the leads of the lower chip and the corresponding leads of the upper chip are pressedly joined so as to be superposed, and symbols 284a and 284b denote sprocket holes.

Figure 33A:
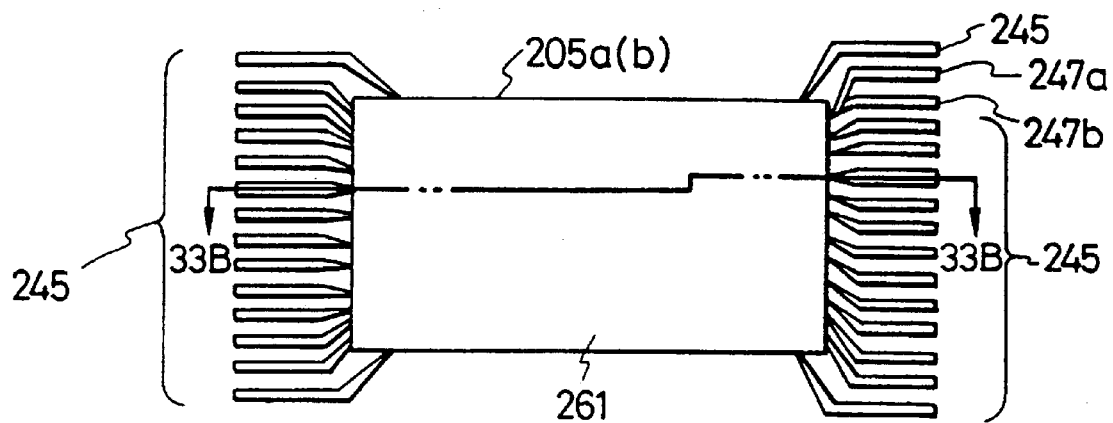
FIGS. 33(a) and 33(b) are a bottom view of a multiple memory chip and lead complex and a sectional view taken along 33B—33B in FIG. 33(a), respectively.
Figure 33B:
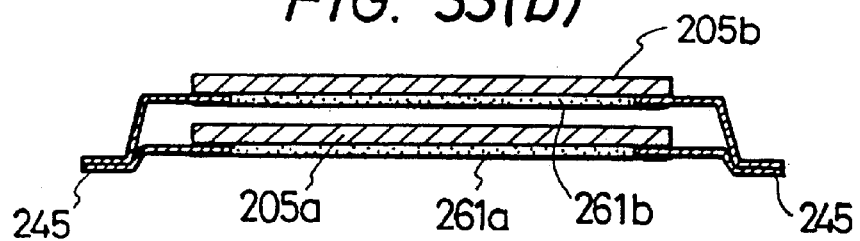

FIGS. 33(a) and 33(b) are a bottom view and a sectional view (taken along 33B—33B in FIG. 33(a)) of a multiple chip multiplex, respectively. The multiple chip multiplex is prepared in such a way that, after the outer leads of the chip-tape multiplexes in FIGS. 31 and 32 have been joined by thermocompression, the joined outer leads are cut near the edges of the device hole and are finally bent and formed like a SOP (small outline package). Referring to FIGS. 33(a) and 33(b), symbols 205a and 205b denote the upper and lower chips, respectively (although the upper and lower positions are reversed in the illustration, the upper and lower chips are defined as mentioned above for the sake of the description of an assembling method). Numeral 245 designates the superposed and bent outer leads. Symbols 247a and 247b denote the $\overline{CS}$ terminal leads of the upper and lower chips, respectively. These $\overline{CS}$ terminal leads are not superposed and thermocompression joined, but they are individually formed into shapes similar to those of the other leads. Numeral 261 and symbols 261a and 261b indicate resin potting layers formed on the first principal surfaces of the respective chips.

FIGS. 34–37 are sectional flow diagrams showing a process in which the multiple chip complexes shown in FIGS. 33(a) and 33(b) are installed by solder reflow on both the surfaces of the laminated ceramic wiring base plate 209 as shown in FIG. 21(a). Referring to FIGS. 34–37, numeral 209 designates the ceramic package base plate, and numeral 263 the outer lead of the module. Symbols 264a–264d denote foot print portions made of metallized layers which serve to solder the multiple chip complexes 234a–234h and decoder ICs 233a and 233b. Solder cream layers 265a–265d are formed on the foot print portions by screen printing. A bonding member 266 serves to hold the multiple chip complex which lies on the lower side during the solder reflow operation. Shown at symbols 267a–267d are solder joint portions which have solidified after the reflow.

Figure 38:
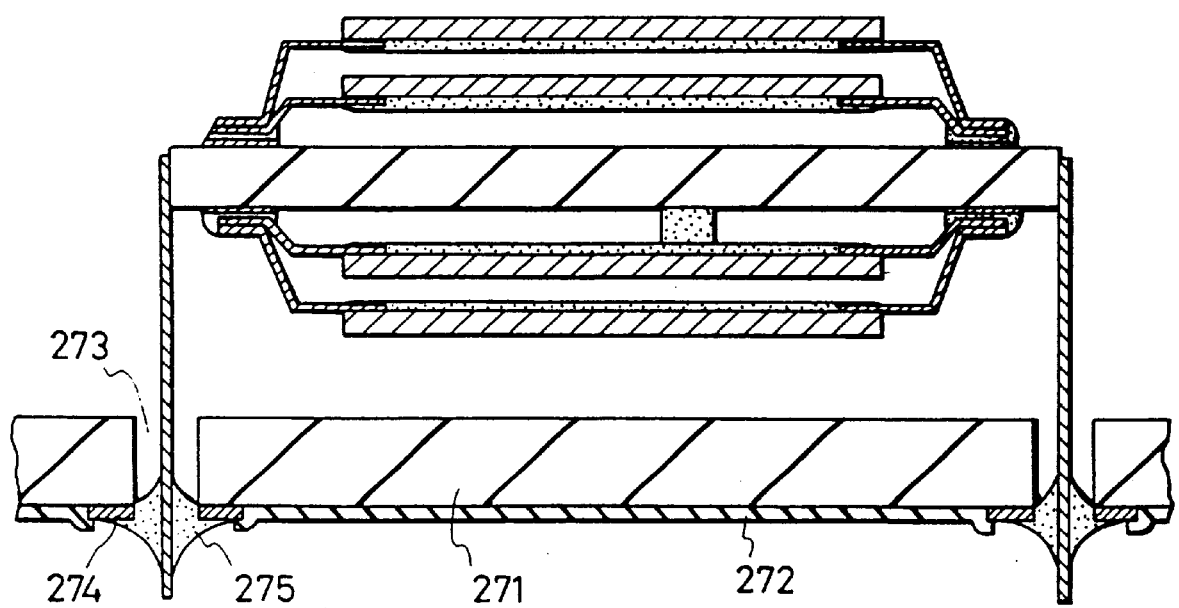
FIG. 38 is a sectional view showing the state of the inserted installation of the memory module on a glass-epoxy printed-wiring base plate.

FIG. 38 is a sectional installation view showing the state in which the finished memory modules are soldered and installed on an insertion type printed-wiring base plate by solder waving. Referring to the figure, numeral 271 designates the glass-epoxy wiring base plate, numeral 273 a pin inserting hole, numeral 274 a solder ring pad, numeral 272 a solder resist layer, and numeral 275 a soldering part.

Figure 39:
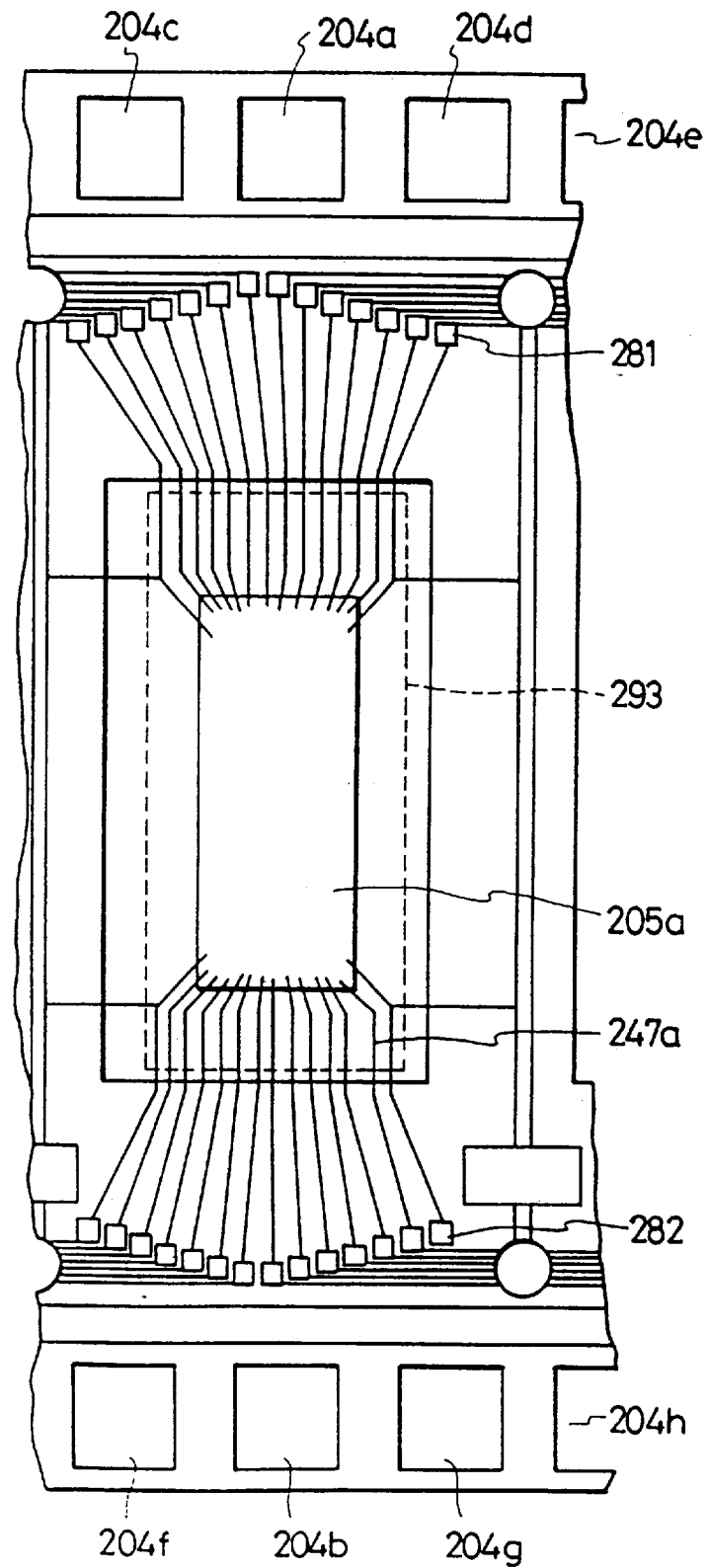
FIG. 39 is a top view showing the upper stage TAB which has been gang-bonded.
Figure 40:
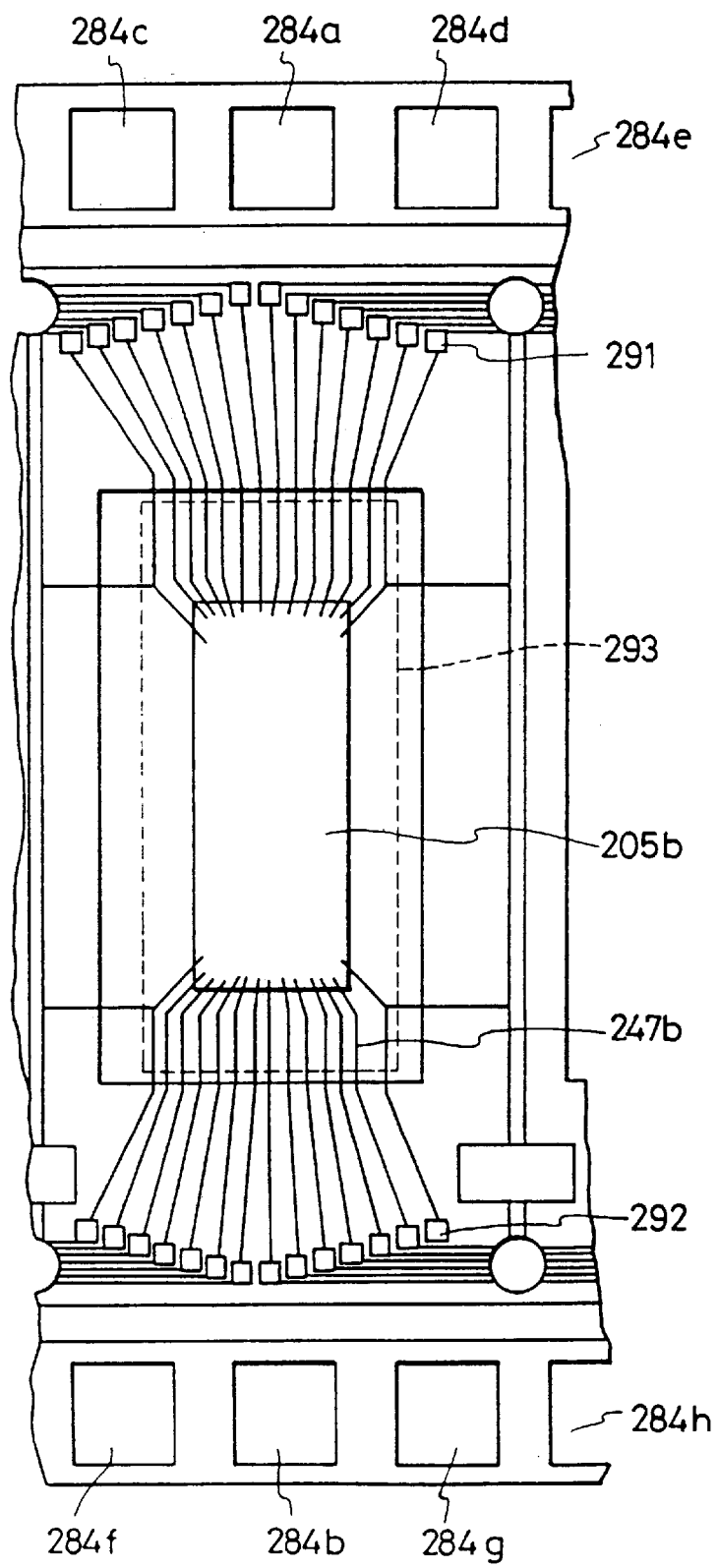
FIG. 40 is a top view of the lower stage TAB similarly gang-bonded.
Figure 41:
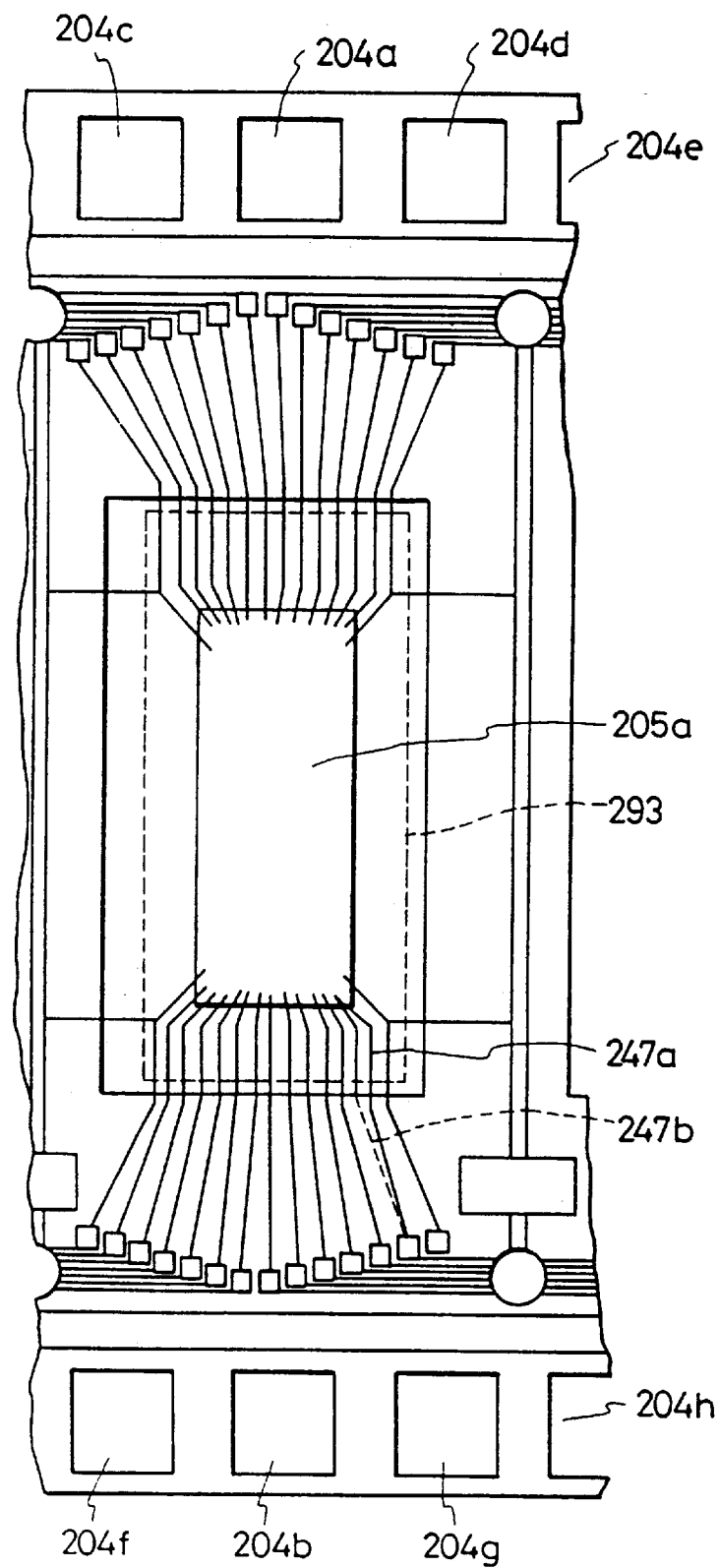
FIG. 41 is a top view showing the state in which the upper stage TAB and the lower stage TAB are stacked.

FIGS. 39–41 are plan views of chip-tape complexes for explaining the foregoing embodiment and the modifications thereof. Patterns in FIGS. 39 and 40 are quite the same as those of FIGS. 23 and 24, respectively.

FIG. 39 is the top plan of the upper chip lead-tape complex (chip-tape complex). In the figure, symbols 204a–204h denote sprocket holes, and symbol 205a denotes the upper memory chip which has a $\overline{CS}$ lead 247a. Numerals 281 and 282 designate Cu test pads which are disposed in every number of 14 on both the sides of the carrier tape. Numeral 293 indicates a part where the corresponding leads of the upper and lower chips brought into pressed contact are cut away from the carrier tape.

FIG. 40 is the top plan of the lower chip-tape complex. In the figure, symbols 284a–284h denote sprocket holes, and symbol 205b denotes the lower memory chip which has a $\overline{CS}$ terminal lead 247b. Numerals 291 and 292 designate test pads which are arranged in every number of 14 on both the sides of the tape. Shown at numeral 293 is a cutting part for the separation between the tape and the multiple chip complex.

FIG. 41 is the top plan of a stacked state showing an assumed case where the upper tape and lower tape are stacked with the upper and lower patterns thereof held substantially in agreement, in order to explain the embodiment. Regarding the lower tape, only parts different from the upper tape are illustrated. In FIG. 41, symbols 204a–204h denote the sprocket holes, symbol 205a denotes the first principal surface of the upper chip, symbols 247a and 247b denote the upper and lower $\overline{CS}$ leads, respectively, and numeral 293 indicates the cutting-away part between the multiple chip complexes and the tapes.

Next, the manufacturing process will be described.

First, upper and lower carrier tapes are prepared. Openings shown in FIGS. 23 and 24, except isolation holes, are formed in a polyimide resin film tape 125 $\mu$m thick by punching. Subsequently, wiring patterns in FIGS. 23 and 24 are formed by etching a copper foil 35 $\mu$m thick. On the whole areas of the wiring patterns, Ni (nickel) barrier layers 259 and Au (gold) layers 260 each having a thickness of 0.5 $\mu$m are formed as shown in FIG. 29 by plating.

Figure 25:
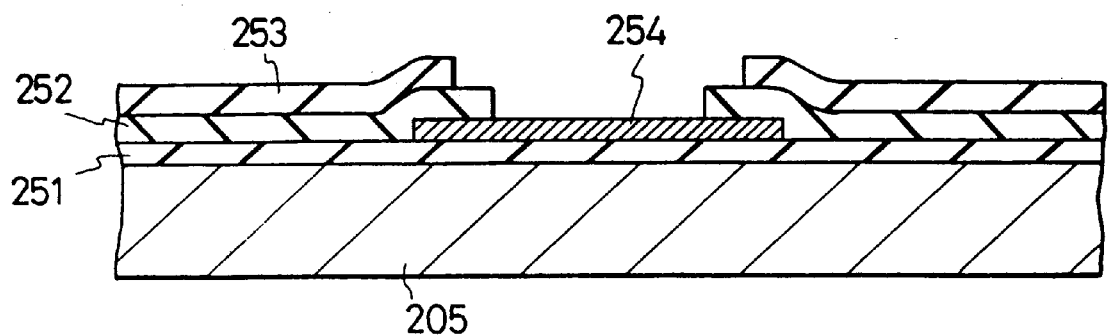
FIGS. 25 thru 28 are sectional flow diagrams showing the wafer process of the SRAM chip in the present invention.

On the other hand, the steps of memory chips will be described from the viewpoint of a wafer process. As shown in FIG. 25, polycrystalline Si gates and an inter-layer PSG film 251 are formed on an Si substrate (a wafer about 600 $\mu$m thick) 205, whereupon Al bonding pads (each being 100 $\mu$m square) 254 are formed simultaneously with Al wiring for internal interconnections. In forming these Al portions, an Al film about 1 $\mu$m thick is deposited on the whole area by sputtering and is thereafter patterned by photolithography. Subsequently, a PSG film which is an inorganic final passivation film and which is about 1.4 $\mu$m thick is formed by CVD (chemical vapor deposition). Likewise to the above, it is formed with openings by photolithography. Next, a polyimide coating solution of PIQ or the like is applied by spin coating to a thickness of about 2.3 $\mu$m. On this occasion, when the surface of the PSG film 252 is subjected to Al chelation beforehand, the adhesion between the polyimide film 253 and the PSG film 252 becomes favorable. After the polyimide coating operation, the resultant structure is baked for vaporizing a solvent. At the next step, the polyimide film is photolithographically formed with openings which are about 10 μm larger in diameter than the foregoing openings. Thereafter, the polyimide film is baked for hardening.

Figure 26:
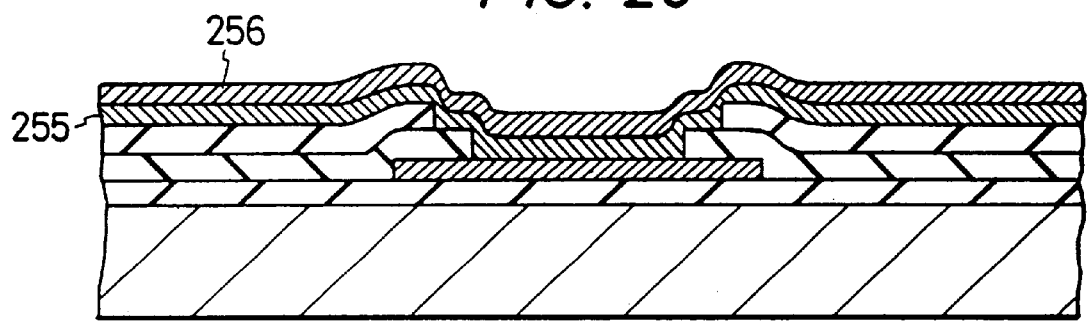

Further, as shown in FIG. 26, underlying barrier metal films for bump electrodes, namely, a Ti (titanium) film 255 which is 0.18 μm thick and a Pd (palladium) film 256 which is 0.17 μm thick are successively formed by evaporation.

Figure 27:
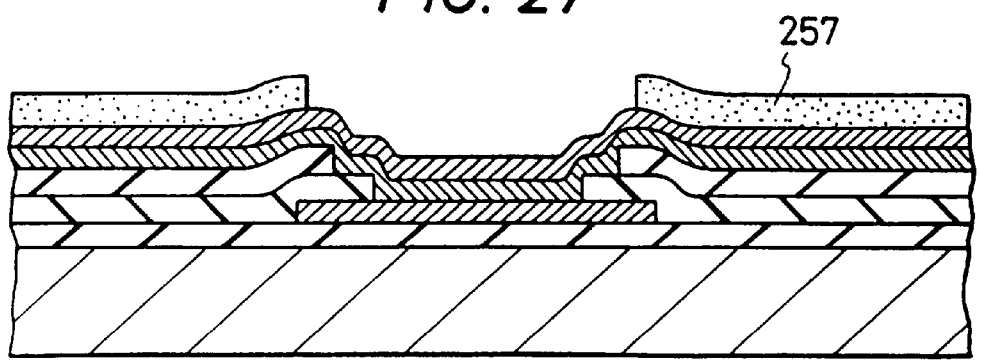

As shown in FIG. 27, a laminated photoresist 257 which is 20 μm thick is applied on the whole surface, and it is formed with openings by photoetching so as to become about 10 μm larger in diameter than the underlying polyimide openings. Under this state, the Au (gold) bump electrodes 258 are formed in the openings of the openings by the electroplating of Au (gold) at a thickness of about 20 μm.

Next, as shown in FIG. 28, the photoresist film 257 is removed with the Au bumps 258 left behind. Further, using the Au bumps 258 as a mask, the unnecessary parts of the UBMs (underlying barrier metals) are removed by chemical etching or back sputtering. Then, the Au bump electrodes are finished.

After the electrical tests of the chips in the wafer, the wafer is divided into the individual chips (4 mm×10 mm×0.25 mm) as shown in FIG. 19 by dicing. Here, before the dicing operation, the wafer is made 250 μm thick by back grinding.

Next, as shown in FIG. 29, the chips are arranged so that their first principal surfaces may assume positions indicated by broken lines 205 in FIGS. 23 and 24, respectively, and a heated tool for TAB bonding is pressed from above, whereby the Au bumps 258 and the Au plating layers 260 of the leads 245 are bonded by thermocompression. This is the so-called gang bonding process.

Subsequently, as shown in FIG. 30, under the state under which a large number of chips are bonded to a long tape 242, a fluid epoxy resin for potting is let fall from above and is cured, thereby to form organic resin molding layers 261 which are about 50 μm thick. Owing to the molding layers, the surfaces of the chips 205 are protected, and the Au bumps 258 and parts of the leads 245 are sealed, while the joining thereof is secured.

Subsequently, in the long tape state and as shown in FIGS. 39 and 40, the upper TAB and lower TAB are subjected to aging and selection tests by utilizing test pads 281, 282, 291 and 292.

At the next step, as shown in FIGS. 31 and 32, the upper and lower TABs are split into units, and the leads are formed like those of SOPs (small out-line packages) so that the portions 262a and 262b of the upper and lower TABs may be stacked. In this case, the upper TAB undergoes little deformation and can therefore have its leads formed in the perfect unit TAB state. Since, however, the lower TAB exhibits a large amount of deformation, the tape is separated near the outermost side of the outer leads.

Next, using the sprocket hole 204a as a positioning hole, the chips are stacked in order to establish the positional relations of the leads as schematically shown in FIG. 41. A bonding tool (tool load: 570–750 gr./lead, tool temperature: 530–570° C., depressing time: 1–5 seconds) is depressed on the portions 262a and 262b in FIGS. 31 and 32, thereby to bond the corresponding leads by thermocompression.

Next, the carrier tapes and the chip-lead complexes are separated by cutting the leads at a cutting part 293 in FIG. 41. In this way, a multiple chip complex whose sectional configuration is as shown in FIG. 33(b) is finished.

FIGS. 34–37 illustrate the process of installation on a ceramic base plate 209 for memory modules as shown in FIG. 21(a).

Figure 34:
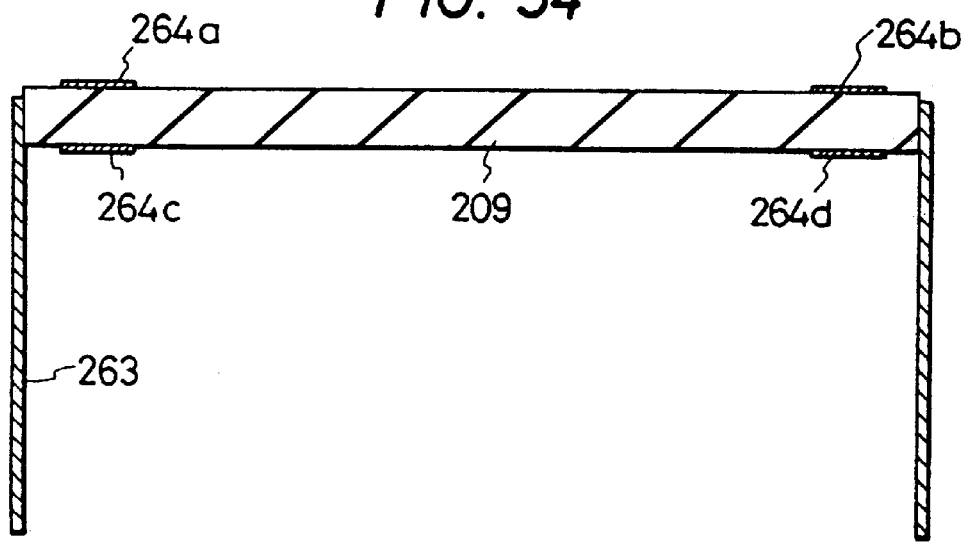
FIGS. 34 thru 37 are sectional flow diagrams showing a process for the flat packaging of the multiple chip and lead complexes like SOPs (small out-line packages) and decoder ICs on a laminated ceramic wiring base plate.

First, a ceramic package body as shown in FIG. 34 is prepared. The typical dimensions of a ceramic package are 40 mm in length, 15 mm in width and 2 mm in thickness. Further, the pitch of leads 263 ("42 Alloy" plated with Ni-Si) is 2.54 mm. The ceramic package is made of a multilayer wiring base plate whose material is alumina ceramics.

Figure 35:
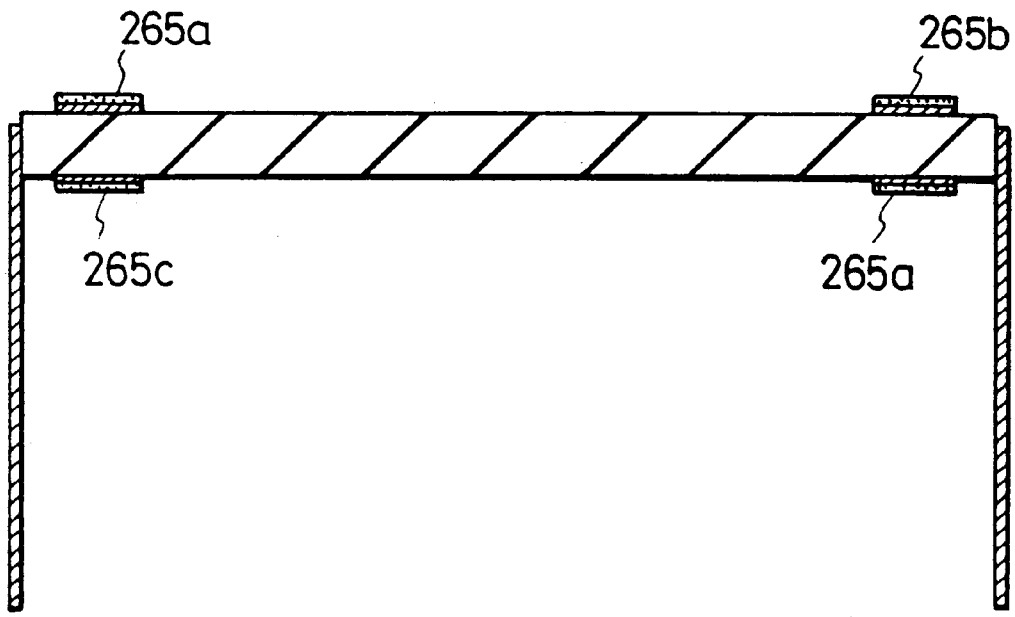

Subsequently, as shown in FIG. 35, metallized foot print portions 264a–264d on the base plate are overlaid with solder cream layers 265a–265d by screen printing.

Figure 36:
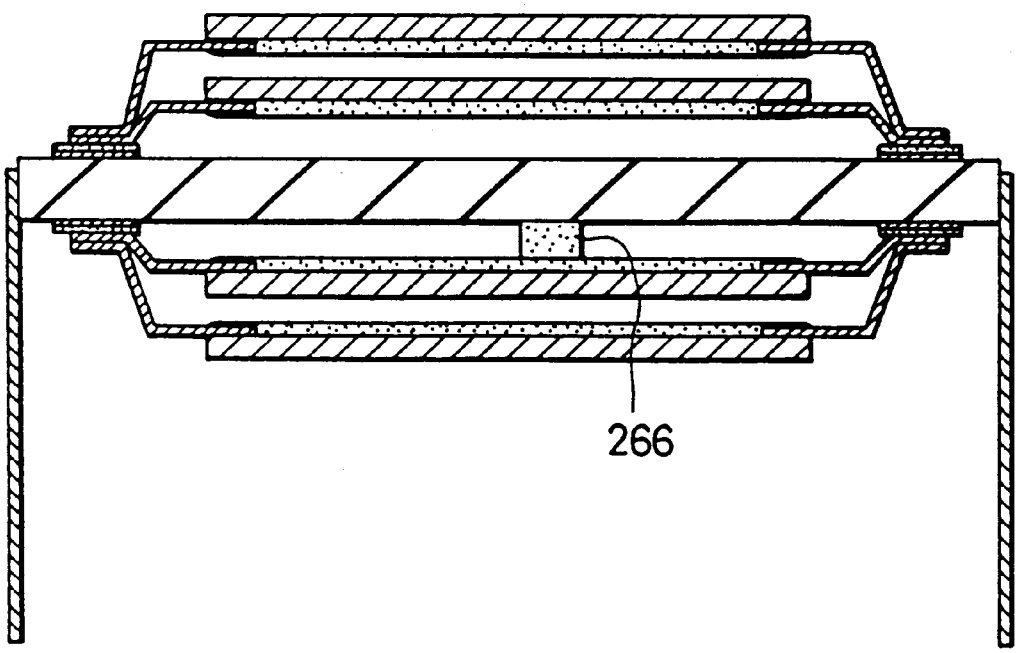

Subsequently, as shown in FIG. 36, the multiple chip complexes are placed on the upper and lower surfaces of the base plate 209 so that the outer ends of the outer leads and the vicinities thereof may abut on the corresponding solder cream layers. The lower multiplex need to have its rear surface supported by an adhesive or bonding member 266.

Figure 37:
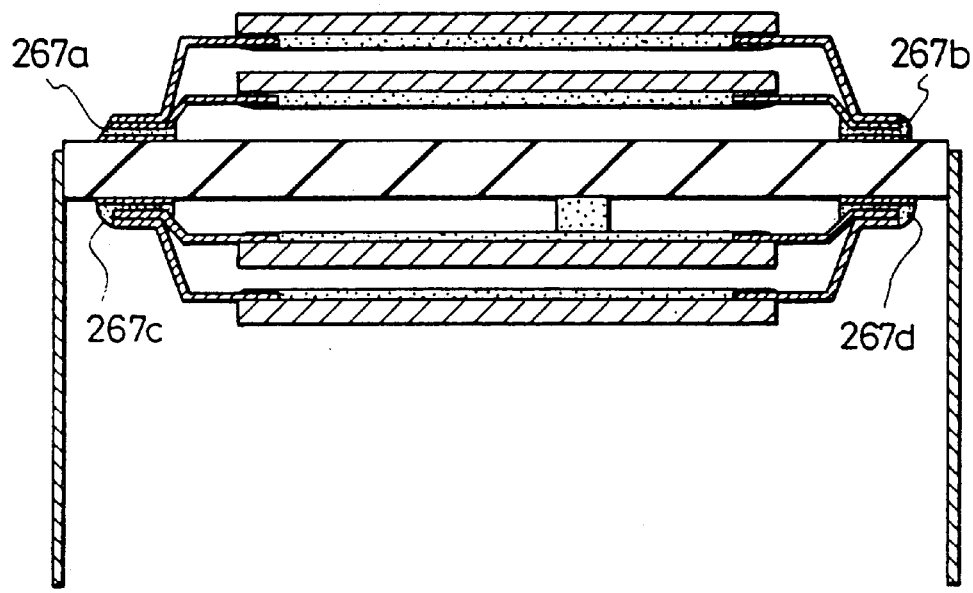

Next, the resultant structure is inserted into a reflow furnace at about 220° C. and is thus subjected to reflow soldering as shown in FIG. 37.

Further, as illustrated in FIG. 38, the memory modules are inserted into a printed-wiring base plate 271 made of glass epoxy or the like, and solder waving is applied from below the printed base plate 271 under this state, whereby soldering is completed.

Figure 42A:
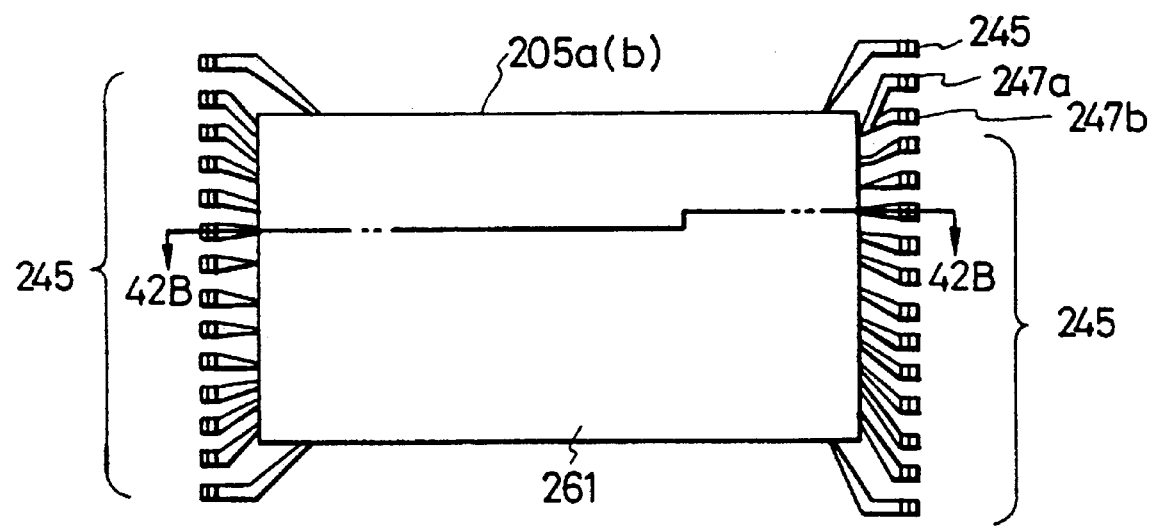
FIGS. 42(a) and 42(b) are a bottom view and a sectional view taken along 42B—42B showing a butt lead type complex which is another embodiment of the multiple chip and lead complex in FIGS. 33(a) and 33(b), respectively.
Figure 42B:
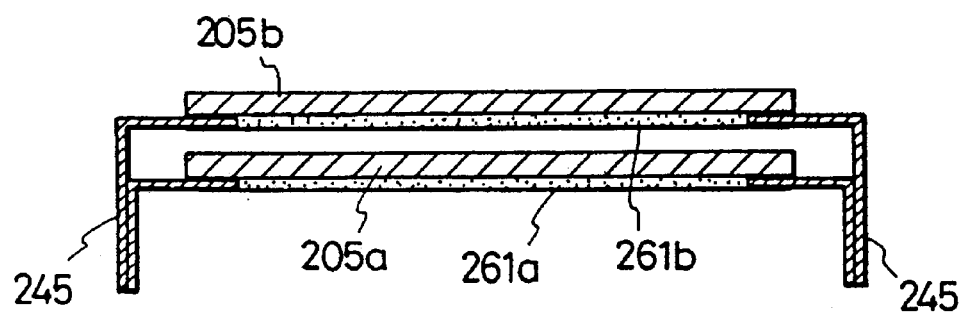

FIGS. 42(a) and 42(b) are a bottom view and a sectional view (taken along 42B—42B in FIG. 42(a)) of a multiple chip-lead complex in another embodiment of the present invention, respectively. Referring to the figures, symbols 205a and 205b denote upper and lower memory chips, respectively. Numeral 245 designates leads (outer leads) which are connected to pads having the same function, except pads $\overline{cs}$. Symbols 247a and 247b denote outer leads which are connected to the $\overline{cs}$ pads of the upper and lower chips, respectively. Symbols 261a and 261b denote epoxy resin layers which are formed, for potting purposes, on the device surfaces of the upper and lower chips, respectively. In case of this example, assembly steps are substantially the same as those of the example in FIGS. 18–41, but only the step of forming the leads needs to be carried out after separating the multiple chip complex from the tape. In this regard, it is also possible that the outer leads of the multiple chip-lead complex are bent and formed in the tape state in which the parts other than the support leads 246 in FIG. 23 are separated from the tape. This holds true also of the SOP type stated before.

Although the above description has referred to FIGS. 18–42(b) by taking the concrete TAB systems as examples, the present invention is not restricted thereto.

That is, the examples of FIGS. 18–42(b) are practicable examples for the embodiments in FIGS. 1–17 and are of course applicable to these embodiments.

Further, although only the double chip-lead complex has been described in Embodiment 3, triple quintuple complexes and higher chip-lead complexes can be performed substantially similarly.

Further, the module wiring base plate is not restricted to the ceramic base plate, but a plastic base plate such as glass epoxy printed-wiring base plate as indicated in a cited reference can be applied.

Further, the pressed connection of the corresponding outer leads of the upper and lower TABs is possible even in the ong TAB state, and it can be done in the state in which the outer leads are substantially flat.

It is needless to say that, in addition to the above, various technical alterations as indicated in the following cited references are possible.

(4) References for Supplementing the Description of Embodiments

The details of the wafer processes, device structures, systems etc. of the monolithic chips of SRAMs (static random access memories) are contained in U.S. patent application Ser. No. 899,404 (filed Aug. 22, 1986), Ser. No. 875,674 (filed Jun. 18, 1986) and Ser. No. 764,208 (Aug. 8, 1985), U.S. Pat. No. 4,554,279 as well as British Patent No. 2,092,826 corresponding thereto, etc. Therefore, these shall form the description of the present invention.

Regarding TAB (tape automated bonding), by way of example, a polyimide tape and copper metallizing thereon, a method of forming bump electrodes for TAB inner lead connection on a semiconductor chip, the gang bonding of TAB inner leads with a chip, and the installing and sealing methods of the TAB inner leads are contained in U.S. patent application Ser. No. 052,386 (filed May 21, 1987) and Ser. No. 946,951 (filed Dec. 29, 1986); "Nikkei Electronics" dated Nov. 27, 1978, pp. 197–211, and the same dated Dec. 19, 1983, pp. 82–85; "Nikkei Microdevices," October 1987, pp. 36–38, and February 1987, pp. 43–44, the same dated Jun. 11, 1984, pp. 148–159, pp. 130–147 and pp. 46–48, and the same, March 1986, pp. 128–135; "Solid State Technology," March 1979, pp. 52–55; "Denshi Zairyo (Electronics Materials)," September 1987, pp. 51–56; "Electronics" dated Aug. 21, 1986, pp. 74–76; "JST News," Vol. 3, No. 2, April 1984, pp. 42–43; "VLSI Technology" by Sze, 1983, pp. 558–570; "IC-ka Jisso Gijutsu (IC-implementation Packaging Technology)" edited by Nippon Microelectronics Kyokai and issued by Kogyo Chosa-kai, pp. 102–175; and "Denshibuhin no Jidokumitate Nyumon (Introduction to Automatic Assemblage of Electronic Components)" issued by Nikkan Kogyo Shinbun-sha on Jul. 30, 1986, pp. 90–100. Therefore, these shall be substituted for the description of the present invention.

Further, a memory module is contained in "Nikkei Electronics" dated Sep. 7, 1987, pp. 99–107, and a method of manufacturing a printed-wiring base plate for the memory module, etc. are contained in "Nikkei Microdevices" dated Jun. 11, 1984, pp. 160–168. Therefore, these shall be substituted for the description of the embodiments of the present invention.

What is claimed is:

1. A semiconductor memory module comprising:

(a) a substrate of a plate shape having a first surface and a second surface opposite to said first surface, said substrate having wirings, first and second electrode pads formed on said first and second surfaces of said substrate respectively;

(b) a plurality of first devices disposed on said first surface of said substrate; and (c) a plurality of second devices disposed on said second surface of said substrate, each of said first and second devices having a semiconductor chip and leads which are electrically connected to said semiconductor chip, said semiconductor chip having a memory circuit comprising a plurality of semiconductor elements, said leads including electrically common leads and an electrically independent lead, tips of said leads of said first and second devices being contacted with said first and second electrode pads respectively;

wherein said electrically common leads of said first and second devices are commonly coupled to one another by first ones of said wirings, wherein said electrically independent leads of said first devices are commonly coupled to one another by second ones of said wirings, wherein said electrically independent leads of said second devices are commonly coupled to one another by third ones of said wirings, and wherein said electrically independent leads of said first devices and said electrically independent leads of said second devices are electrically independent from each other.

2. A semiconductor memory module according to claim 1, wherein said electrical common leads of said first and second devices include address signal leads and data signal leads, and wherein said electrical independent leads of said first and second devices includes chip selecting signal leads.

3. A semiconductor memory module according to claim 2, wherein said substrate has a substantially rectangular shape in a plane view, wherein said substrate has a pair of longer edges extending in a first direction and a pair of shorter edges extending in a second direction substantially perpendicular to said first direction, and wherein said substrate further has a plurality of terminals which are arranged along one of said pair of longer edges in said first direction and for interacting with an external device in signals.

4. A semiconductor memory module according to claim 3, wherein said plurality of terminals includes terminals which can select ones of either of said first and second devices in response to signals inputted from said external device.

5. A semiconductor memory module according to claim 4, further comprising a third device on said substrate, and wherein said third device includs a logic device.

6. A semiconductor memory module according to claim 5, wherein said signals inputted from said external device for selecting ones of either of said first and second devices are provided to said first and second devices via said third device.

7. A semiconductor memory module according to claim 6, wherein said third device is arranged at a substantially central position of said substrate with respect to said pair of shorter edges, and wherein said first and second devices are arranged between said third device and said pair of shorter edges respectively.

8. A semiconductor memory module according to claim 7, wherein each of said semiconductor chips of said first devices has the same function as that of said second devices.

9. A semiconductor memory module according to claim 8, wherein each of said semiconductor chips of said first and second devices has a plurality of electrodes formed on a main surface thereof and said plurality of electrodes are electrically coupled to the corresponding leads respectively, and wherein an arrangement of said plurality of electrodes of said first devices is the same as that of said plurality of electrodes of said second device in the plane view.

10. A semiconductor memory module according to claim 9, wherein each of said first and second devices is a tape carrier package having a resin film, a semiconductor chip disposed in a device hole formed in said resin film and flexible leads formed on said resin film.

* * * * *